US012495875B2

(12) United States Patent
Vaudreuil

(10) Patent No.: US 12,495,875 B2
(45) Date of Patent: Dec. 16, 2025

(54) CARD HOLDER

(71) Applicant: René Vaudreuil, Notre-Dame-des-Monts (CA)

(72) Inventor: René Vaudreuil, Notre-Dame-des-Monts (CA)

( * ) Notice: Subject to any disclaimer, the term of this patent is extended or adjusted under 35 U.S.C. 154(b) by 352 days.

(21) Appl. No.: 18/128,094

(22) Filed: Mar. 29, 2023

(65) Prior Publication Data

US 2023/0309670 A1 Oct. 5, 2023

(30) Foreign Application Priority Data

Apr. 4, 2022 (GB) ..................................... 2204940

(51) Int. Cl.
*A45C 11/18* (2006.01)
*A45F 5/02* (2006.01)
*H05K 9/00* (2006.01)

(52) U.S. Cl.
CPC ............ *A45C 11/182* (2013.01); *A45F 5/021* (2013.01); *H05K 9/0007* (2013.01); *A45C 2011/186* (2013.01)

(58) Field of Classification Search
CPC ... A45C 11/182; A45C 2011/186; A45C 1/06; A45C 11/18; A45F 5/021; A45F 5/155; B42D 25/22; B42D 25/00
USPC ................................................. 224/242, 663
See application file for complete search history.

(56) References Cited

U.S. PATENT DOCUMENTS 1,415,276 A 5/1922 Terner
1,658,496 A 2/1928 Qvarnstrom
4,202,120 A * 5/1980 Engel .................... G06V 40/13 283/69
4,202,445 A 5/1980 Porter
4,697,698 A * 10/1987 Holdener ............. A45C 11/182 206/37
4,792,058 A 12/1988 Parker
4,934,520 A 6/1990 Okada
D314,865 S 2/1991 Tuisku
5,020,255 A * 6/1991 Rodel .................. A45C 11/182 206/37.1
5,125,505 A * 6/1992 Kurosaki .................. G09F 3/18 206/556
5,326,964 A 7/1994 Risser
(Continued)

FOREIGN PATENT DOCUMENTS

BE 1018952 11/2011
CA 2030111 5/1991
(Continued)

OTHER PUBLICATIONS

DE-102013010389 with Translation (Year: 2014).*

*Primary Examiner* — Adam J Waggenspack

(57) ABSTRACT

A card holder for carrying a card and movable between card hiding, showing and protruding configurations. The card holder includes a casing defining a front aperture and a card slit, and a front cover for selectively covering the front aperture. In the card hiding configuration, the front cover obstructs the front aperture and the card is entirely contained in the casing. In the card showing configuration, the front cover is retracted from at least part of the front aperture and the card is entirely contained in the casing. In the card protruding configuration, part of the card protrudes from the casing through the card slit.

15 Claims, 13 Drawing Sheets

(56) References Cited

U.S. PATENT DOCUMENTS

| | | | | |
|---|---|---|---|---|
| 5,337,813 | A * | 8/1994 | Ritter | G06K 19/077 150/147 |
| 6,155,410 | A | 12/2000 | Davis | |
| 6,601,329 | B2 * | 8/2003 | Vaudreuil | G09F 3/20 40/655 |
| 6,848,577 | B2 | 2/2005 | Kawamura et al. | |
| D575,506 | S | 8/2008 | Huang | |
| D632,695 | S | 2/2011 | Berntsen | |
| 7,921,890 | B2 | 4/2011 | Ho | |
| D760,496 | S | 7/2016 | Schiøll | |
| 9,572,292 | B2 | 2/2017 | Wilczynski | |
| 9,907,375 | B1 | 3/2018 | Kitchen | |
| 9,922,277 | B1 * | 3/2018 | Hess | G06K 19/04 |
| D844,322 | S | 4/2019 | Bo | |
| 10,793,342 | B2 * | 10/2020 | Minson | B65D 83/0829 |
| D934,560 | S | 11/2021 | Tran et al. | |
| 11,317,528 | B2 | 4/2022 | Wei et al. | |
| 11,344,091 | B2 * | 5/2022 | Goodwin | A45C 13/1069 |
| D954,435 | S | 6/2022 | Yang | |
| 11,369,186 | B1 | 6/2022 | Dixon | |
| D972,841 | S | 12/2022 | Tran et al. | |
| 2003/0057112 | A1 | 3/2003 | Keough | |
| 2008/0185412 | A1 * | 8/2008 | Hollins | A45F 5/02 224/660 |
| 2009/0084012 | A1 * | 4/2009 | Kung | G09F 3/20 40/642.02 |
| 2014/0060712 | A1 * | 3/2014 | Beckley | A45C 1/06 150/133 |
| 2018/0211073 | A1 * | 7/2018 | Kwan | G06K 19/07741 |
| 2021/0011988 | A1 | 1/2021 | Tonnoir | |

FOREIGN PATENT DOCUMENTS

| | | | |
|---|---|---|---|
| CN | 205624937 | | 10/2016 |
| CN | 108991688 | | 12/2018 |
| DE | 102013010389 | A1 * | 1/2014 |
| EP | 580890 | A1 | 2/1994 |
| EP | 580890 | B1 | 5/1997 |
| FR | 2716093 | | 8/1995 |
| FR | 2770102 | | 4/1999 |
| FR | 2893233 | | 5/2007 |
| FR | 3033065 | | 8/2016 |
| FR | 3063878 | | 9/2018 |
| JP | 03151947 | | 7/2009 |
| JP | 05219991 | | 6/2013 |
| KR | 200800403 | | 4/2008 |
| KR | 2425526 | | 7/2022 |
| NL | 199301898 | | 6/1995 |
| WO | 1991001096 | | 2/1991 |
| WO | 1998038621 | | 9/1998 |
| WO | 2012069789 | | 5/2012 |

* cited by examiner

308

CARD HOLDER

FIELD OF THE INVENTION

The present invention relates to the general field of privacy of information, and is more particularly concerned with a card holder.

BACKGROUND

There is often a need for storing and protecting a personal identification card, a credit card, or any similar card. One may for example wish to reduce the likelihood that the information carried by the card, either in printed, embossed or wirelessly accessible form, is accessed by unauthorized people. While card carrying cases are used for that purpose, they often have one or more of the following disadvantages.

First, many such card carrying cases don't allow one to expose part of the carried card to a machine readable chip that would allow insertion of the chip in a reader. While some rigid wallets allow one to remove the card from the wallet, this feature is undesirable in many applications, as one would want the card and carrying case to be tamper-proof, so that the card carried in the carrying case cannot be altered without detection. Furthermore, one may wish to allow visual inspection of the card without removing the card from the case, which is not possible is the card is completely enclosed.

Thus, there is a need on the market for an improved card holder. An object of the present invention is therefore to provides such a card holder.

SUMMARY OF THE INVENTION

In a broad aspect, there is provided a card holder for carrying a card, the card defining a card front face, the card holder comprising: a casing, the casing defining a card receiving portion for receiving the card, the casing further defining a front aperture substantially parallel to and in register with the card receiving portion so that a card received in the card receiving portion shows at least part of the card front face through the front aperture; a front cover movable between a card hiding configuration wherein the front aperture is covered by the front cover to obstruct from view the card front face, and a card showing configuration wherein the front cover is retracted from at least part of the front aperture to at least partially show the card front face; the casing further defining a card slit positioned adjacent the card receiving portion, the card slit and card receiving portion being operatively coupled to each other to allow selective passage of at least part of the card from the card receiving portion and through the card slit so that the card at least partially protrudes from the casing.

There may also be provided a card holder further comprising a stopper movable between an obstructing position wherein the stopper is between the card receiving portion and the card slit to prevent the card from moving from the card receiving portion to the card slit and a released position wherein the stopper is retracted from the card slit.

There may also be provided a card holder wherein the front cover is slidable across the front aperture when moving between the card hiding and showing configurations.

There may also be provided a card holder wherein the casing defines a cover slit for allowing passage of at least part of the front cover therethrough when the front cover is moved from the card hiding configuration to the card showing configurations.

There may also be provided a card holder wherein the front cover includes a carriage component mounted to the casing and slidable therealong in a direction perpendicular to the cover slit, the carriage component being mounted to the casing so that sliding the carriage along the casing moves the front cover between the card hiding and showing configurations.

There may also be provided a card holder wherein the cover slit and the card slit are substantially perpendicular to each other.

There may also be provided a card holder wherein the front cover defines a concealable area, wherein, in the card hiding configuration, the concealable area is hidden inside the casing, and in the card showing configuration, the concealable area protrudes from the casing.

There may also be provided a card holder wherein the carriage defines a stopper, the stopper being between the card receiving area and the card slit in the card hiding configuration, and the stopper being withdrawn from the card receiving portion in the card showing configuration to allow selective movement of at least part of the card from the card receiving portion to the card slit.

There may also be provided a card holder wherein the card holder includes a single card receiving portion configured for receiving a single card thereinto.

There may also be provided a card holder further comprising a card handler for holding the card, the card handler being mounted to the casing in register with the front aperture so as to be movable therealong in a direction substantially perpendicular to the card slot, the card handler being movable between card handler retracted and extended configurations, wherein the card handler is closer to the card slit in the card handler extended configuration than in the card holder retracted configuration.

There may also be provided a card holder wherein the casing further includes a wirelessly accessible element including information accessible through a wireless communication protocol.

There may also be provided a card holder wherein the casing further includes a frame defining the front aperture and a rear plate extending across the card receiving portion opposed to the front aperture.

There may also be provided a card holder wherein the card receiving portion includes card holding members for mounting the card thereto, the card mounting member being configured and sized to prevent removal of the card through the front aperture.

There may also be provided a card holder wherein the casing defines a Faraday cage around the card in the card hiding configuration.

There may also be provided a card holder further comprising a belt holster case for holding the casing.

In another broad aspect, there is provided a combination comprising: a card defining a card front face and an opposed card rear face; a casing for enclosing the card, the casing defining a card receiving portion for receiving the card, the casing further defining a front aperture substantially parallel to and in register with the card receiving portion so that a card received in the card receiving portion shows at least part of the card front face through the front aperture, the casing further defining a card slit positioned adjacent the card receiving portion; and a front cover mounted to the casing. The combination is movable between a card hiding configuration, a card showing configuration, and a card protruding configuration. In the card hiding configuration, the front cover obstructs the front aperture and the card is entirely contained in the casing. In the card showing configuration, the front cover is retracted from at least part of the front aperture and the card is entirely contained in the casing. In the card protruding configuration, part of the card protrudes from the card slit outside of the casing.

There may also be provided a combination wherein the front cover is slidable along the casing when moving from the hiding to the showing configuration.

There may also be provided a combination wherein the card is prevented from protruding through the card slit when the front cover obstructs the front aperture.

There may also be provided a combination wherein the front cover defines a concealable area, wherein in the card hiding configuration, the concealable area is hidden inside the casing, and in the card showing configuration, the concealable area protrudes from the casing.

There may also be provided a combination wherein the casing is tamper-proof to prevent undetected removal of the card from the casing.

Advantageously, the proposed card holder allows one to selectively show only the visual information present on the card, or to also make available electronic information contained, for example, on a microchip. In some embodiments, the proposed card holder is relatively easy to use, relatively economical to manufacture, and can be made tamper-proof, for example for applications requiring a high degree of security.

Other objects, advantages and features of the present invention will become more apparent upon reading of the following non-restrictive description of some embodiments thereof, given by way of example only with reference to the accompanying drawings.

Figure 1:
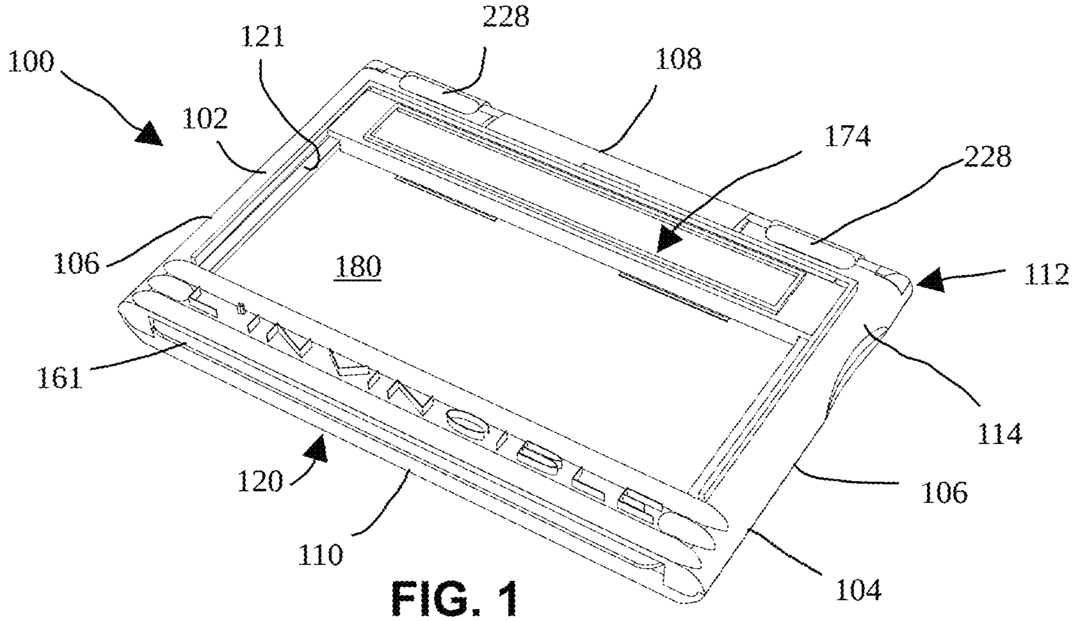
FIG. 1, in a front perspective view, illustrates an embodiment of a card holder, according to the present invention, here shown in a card hiding configuration.

The present invention claims priority from UK patent application GB2204940.7 filed Apr. 4, 2022, the contents of which is hereby incorporated by reference in its entirety.

DETAILED DESCRIPTION

The terms "substantially" and "about" are used throughout this document to indicate variations in the thus qualified terms. These variations are variations that do not materially affect the manner in which the invention works and can be due, for example, to uncertainty in manufacturing processes or to small deviations from a nominal value or ideal shape that do not cause significant changes to the invention.

FIGS. 1 to 4 collectively illustrate various aspects of an embodiment, according to the present invention, of a card holder 100 for receiving and protecting against unauthorized access a card, such as for example a standard size, thin walled information card 300. non-limiting examples of such information cards 300 include an identification card, a social or medical insurance card, a high security access pass and a credit card, among others, that is displaying and/or electronically storing information. The information card 300 defines a card front face 302 and an opposed card rear face 312.

Referring to FIGS. 1, 2, 4 and 56, the card holder 100 has a generally planar and rectangular configuration defining a front side 102, a rear side 104, opposed lateral edges 106, and opposed top and bottom edges 108 and 110, respectively.

Figure 4:
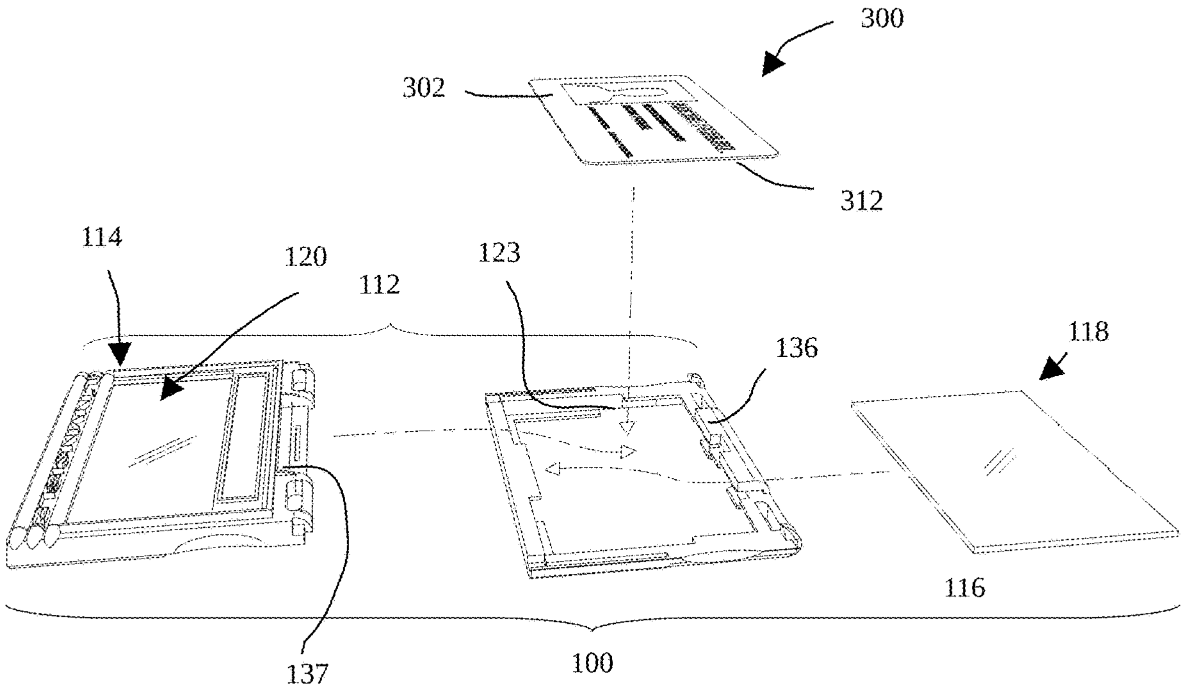
FIG. 4, in a perspective, exploded view, illustrates the card holder in FIG. 1 and a card to be held thereby.
Figure 5:
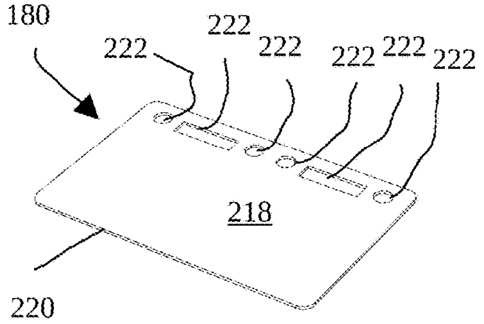
FIG. 5, in a perspective view, illustrates a front cover plate part of the front cover of FIG. 3.
Figure 6:
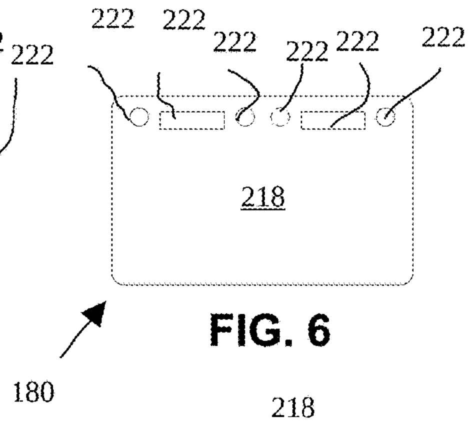
FIG. 6, in a front elevational view, illustrates the front cover plate.
Figure 7:
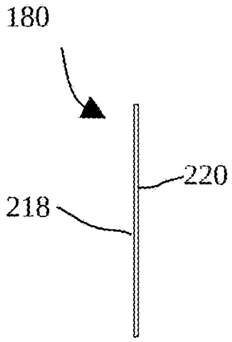
FIG. 7, in a side elevational view, illustrates the front cover plate.
Figure 8:
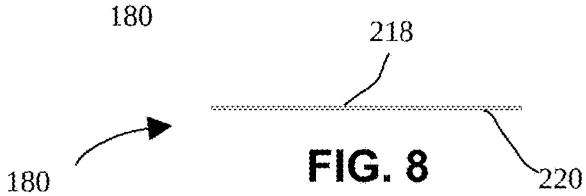
FIG. 8, in a top elevational view, illustrates the front cover plate.
Figure 9:
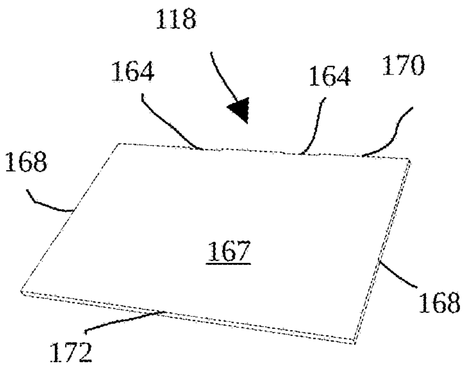
FIG. 9, in a perspective view, illustrates a rear cover plate part of the front cover of FIG. 3.
Figure 10:
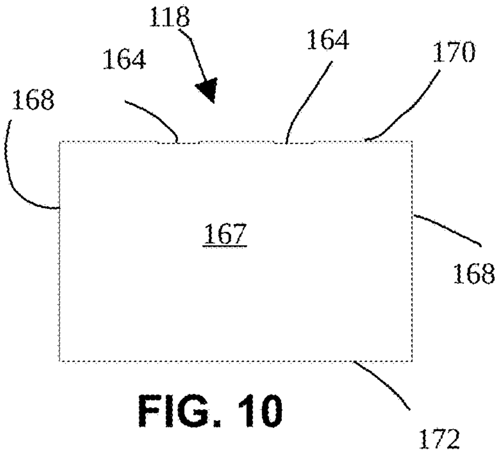
FIG. 10, in a front elevational view, illustrates the rear cover plate.
Figure 11:
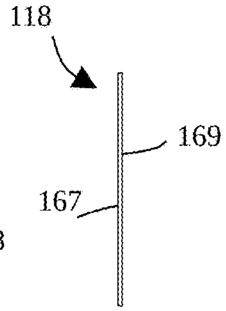
FIG. 11, in a side elevational view, illustrates the rear cover plate.
Figure 12:
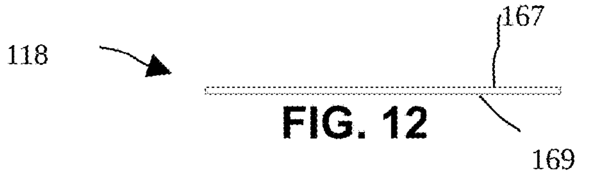
FIG. 12, in a top elevational view, illustrates the rear cover plate.
Figure 13:
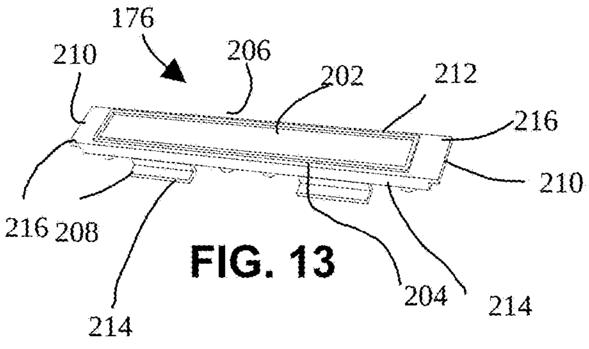
FIG. 13, in a front perspective view, illustrates a carriage component front cover part of the front cover of FIG. 3.
Figure 14:
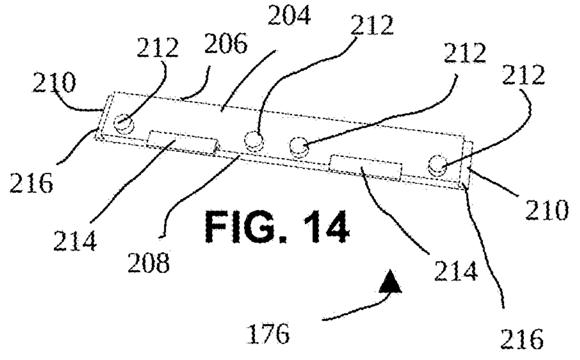
FIG. 14, in a rear perspective view, illustrates the carriage component front cover.
Figure 15:
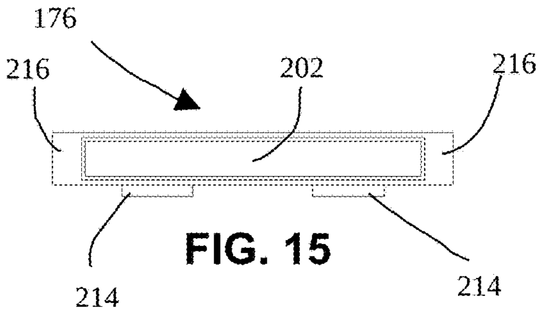
FIG. 15, in a front elevational view, illustrates the carriage component front cover.

Referring more particularly to FIG. 4, the card holder 100 generally comprises a casing 112, which includes a casing front frame 114, a casing rear frame 116, and a rear cover plate 118, and a front cover 120 mounted to the casing 112.

Referring collectively to FIGS. 34 to 40, the casing rear frame 116 defines a casing rear frame outer side 122, a casing rear frame inner side 124, and a casing rear frame window aperture 126 extending substantially centrally throughout, thus defining a casing rear frame window frame 128.

The casing rear frame 116 further defines casing rear frame bottom contour edges 130 extending adjacently the casing rear frame outer side 122, and along portions of each opposed bottom corners of the casing rear frame window aperture 126.

The casing rear frame 116 further defines a first pair of spaced apart protrusions 132 extending inwardly from a substantially centrally located inner top edge portion of the casing rear frame window aperture 126, so as to be co-planar with the casing rear frame bottom contour edges 130.

The casing rear frame 116 further defines a plurality of card engaging ledge segments 134 extending in a common plane around the casing rear frame window aperture 126, and substantially in register with the casing rear frame inner side 124. As it will be described further below, the plurality of card engaging ledge segments 134 are used in cooperation with the rear cover plate 118 to form a card receiving portion 123 to lockingly engage and secure the information card 300 in register with the casing rear frame window aperture 126. The card engaging ledge segments 134 are therefore card holding members used for mounting the information card 130 thereto and typically configured and sized to prevent removal of the card through the front aperture 121.

The casing rear frame 116 further defines a second pair of spaced apart protrusions 136 extending adjacently the casing rear frame inner side 124, and inwardly from a substantially centrally located inner top edge portion of the casing rear frame window aperture 126. The second pair of spaced apart protrusions 136 are configured and sized for engaging the casing front frame top recess 137, which will be described further below.

The casing rear frame 116 further defines a pair of cover engaging protrusions 138 located, respectively, at each opposed top edge ends of the casing rear frame inner side 124, and extending at least partially spaced apart from the casing rear frame inner side 124 and partially parallelly toward the bottom edge of the casing rear frame inner side 124.

The casing rear frame 116 further defines a pair of elongated cover engaging slots 140 extending parallelly relative to one another and adjacently a respective lateral side edge of the casing rear frame inner side 124. Furthermore, each elongated cover engaging slot 140 extends from the lower bottom edge of the casing rear frame inner side 124, and substantially half the distance towards the top edge thereof. Furthermore, each cover engaging slots 140 extends at least partially laterally inwardly relative to its respective lateral side edge of the casing rear frame 116.

Referring to FIGS. 27 to 33 inclusively, the casing front frame 114 has substantially equivalent outer dimensions as the casing rear frame 116, and defines a casing front frame outer side 142, a casing front frame inner side 144, and casing front frame window aperture 146 extending substantially centrally throughout, thus defining a casing front frame window frame 148. When the casing 112 is assembled, the casing front frame window aperture 146 forms a front aperture 121 (seen in FIG. 1 for example) substantially parallel to and in register with the card receiving portion 123, so that the information card 300 received in the card receiving portion 123 shows at least part of the card front face 302 through this front aperture 121, as seen for example in FIG. 2.

The casing front frame window frame 148 defines a lower front edge 150 extending inwardly toward the top edge so as to have a transversal dimension that is at least slightly greater than all the other frame edges of the casing front and rear cover window frames 128 and 148. The utility of this transversally wider lower front edge 150 of the casing front frame 114 will be described further below. All the other frame edges of the casing front and rear cover window frames 128 and 148 have a substantially equivalent cross-sectional dimension.

The casing front frame 114 further defines a pair of corner recesses 152 extending at least partially inwardly relative to a respective top corner of the casing front frame 114. The pair of corner recesses 152 are suitably configured and sized for engaging in a snug fit relation a respective one in the pair of cover engaging protrusions 138 of the casing rear frame 116.

The casing front frame 114 further defines a casing front frame top centred recess 137. The casing front frame top centred recess 137 is suitably configured and sized for engaging therein in a snug fit relation the second pair of spaced apart protrusions 136 of the casing rear frame 116, so as to further rigidly lock the top edge portion of casing front frame 114 with the corresponding top edge portion of the casing rear frame 116.

The casing front frame 114 further defines a pair of elongated cover engaging ledges 154 extending parallelly relative to one another and adjacently a respective lateral side edge of the casing front frame inner side 144. Furthermore, each ledge in the pair of elongated cover engaging ledges 154 extends from the lower bottom edge of the casing front frame inner side 144, and substantially half the distance towards the top edge thereof. Furthermore, each ledge in the pair of elongated cover engaging ledges 154 extends at least partially laterally inwardly relative to its respective lateral side edge of the casing front frame 114. The pair of elongated cover engaging ledges 154 are suitably configured and sized for slidably engaging in a snug fit relation a respective one in the pair of cover engaging slots 140 of the casing rear frame 116. Furthermore, each ledge in the pair of elongated cover engaging ledges 154 includes a stop protrusion 156 located proximally the bottom edge of the casing front frame 114.

Thus, by coplanarly contacting a top half portion of the casing front frame inner side 144 in register with a bottom half portion of the casing rear frame inner side 124, the casing front frame 114 may be slid towards the top edge of the casing rear frame 116 until the bottom end of the pair of elongated cover engaging slots 140 contactingly abuts against the stop protrusions 156. Hence, concurrently, the pair of elongated cover engaging ledges 154 of the casing front frame 114 slidably engages in the pair of elongated cover engaging slots 140 of the casing rear frame 116. Furthermore, the pair of corner recesses 152 of the casing front frame 114 engages with the second pair of spaced apart protrusions 136 of the casing rear frame 116, so as to substantially rigidly engage the casing front frame 114 coplanarly with the casing rear frame 116 to form the assembled body of the casing 112.

Referring to FIGS. 1, 27, 28 and 51, the casing front frame 114 further defines a pair of casing front frame inner lateral side edges 158 extending parallelly and substantially the whole length of a respective one of the inner lateral side edges of the casing front frame window frame 148. The utility of this pair of casing front frame inner lateral side edges 158 will be described along with a description of the front cover 120 further below.

As best illustrated through FIGS. 1, 2, 27, 28, 53 and 54, the casing front frame 114 further defines a front cover bottom recess 159 extending inwardly relative to the front cover inner side 124, between the opposed lateral sides of the window frame 148. The front cover bottom recess 159 is suitably sized and shaped for allowing a lateral cross-section of the information card 300 to freely slide out and in there through, as it will be described further below. The front cover bottom recess 159 therefore defines a cover slit 161 when the casing 112 is assembled.

Figure 53:
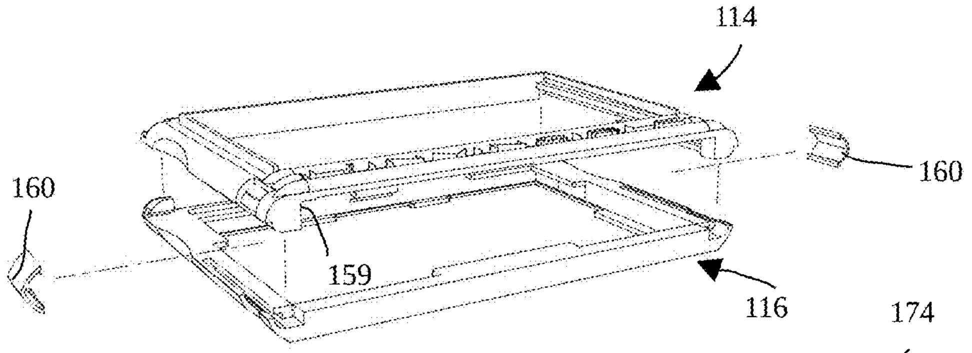
FIG. 53, in a perspective view, illustrates the casing front frame and casing rear frame prior to assembly, along with C-clips.
Figure 54:
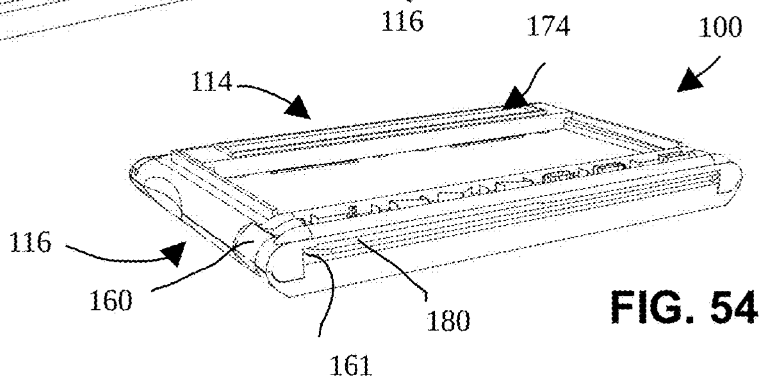
FIG. 54, in a perspective view, illustrates the casing front frame and casing rear frame assembled to each other and locked to one another with the C-clips.

Referring more particularly to FIGS. 53 and 54, the casing front and rear frames 114 and 116 further each define a pair of clip engaging grooves 162 located in register relative to one another along a respective lateral side edge portion thereof and adjacently the bottom edge 110 of the casing 112. The casing 112 further includes a pair of locking C-clips 160.

The corresponding pairs of clip engaging grooves 162 of the casing front and rear frames 114 and 116, and the pair of locking C-clips 160 and correspondingly configured and sized such that, with the casing front frame 114 slidably engaged with the casing rear frame 116, the locking C-clips 160 may be engaged in a respectively paired clip engaging grooves 162 so as to rigidly lock the casing front and rear frames 114 and 116 to each other. Other known locking arrangements to lock together the casing front and rear frames 114 and 116 to one another are also possible including for example, but not limited to, a thermal bonding process, glue cement, threaded bore and locking screw arrangements, or the likes.

Referring collectively to FIGS. 4, 9 to 12, 56 and 57, the rear cover plate 118 has a substantially rectangular planar and thin walled plate configuration defining opposed rear cover plate front and rear sides 167 and 169, rear cover plate lateral side edges 168 and top and bottom edges 170 and 172 respectively.

The rear cover plate 118 is suitably sized to correspond in a snug fit relation to the inner dimensions of the window aperture 126 of the casing rear frame 116. The rear cover plate 118 further defines a pair of relatively small and spaced apart rear cover plate recesses 164 suitably located centrally along the cover plate top edge 170 so as to be laterally in register with the first pair of protrusions 132 of the casing rear frame 116.

The rear cover plate 118 can be inserted through the rear side for the casing rear frame 116 with a relatively light inward bending action of the rear cover plate 118, so as to position and engage the latter between the casing rear frame bottom contour edges 130 along the bottom edge of the window aperture 126, and between the first pair of spaced apart protrusions 132 and the plurality of card engaging ledge segments 134 along the inner edge of the rear frame window aperture 126 and coplanar with the casing rear frame inner side 124, so as to substantially close the latter and form a rear wall of the casing rear frame 116.

In one embodiment of the invention, the rear cover plate 118 is made of a substantially rigid and transparent or translucent plastic material. In another embodiment of the invention, the rear cover plate 118 is made of a substantially rigid and opaque material. In some embodiments, the rear cover plate 118 has electromagnetic screening characteristics, created for example through the use of a suitable metal sheet of material, for preventing unauthorized wireless access to data electronically stored in the information card 300. When combined with a suitable front cover 120 having similar electromagnetic properties, wherein the card holder 100 defines a Faraday cage around the information card 300 when the front cover 120 is positioned in the card hiding configuration. The Faraday cage has properties suitable to prevent access to the wirelessly accessible data by blocking electromagnetic waves having a frequency similar to the frequency used to access the wirelessly accessible data.

Figure 2:
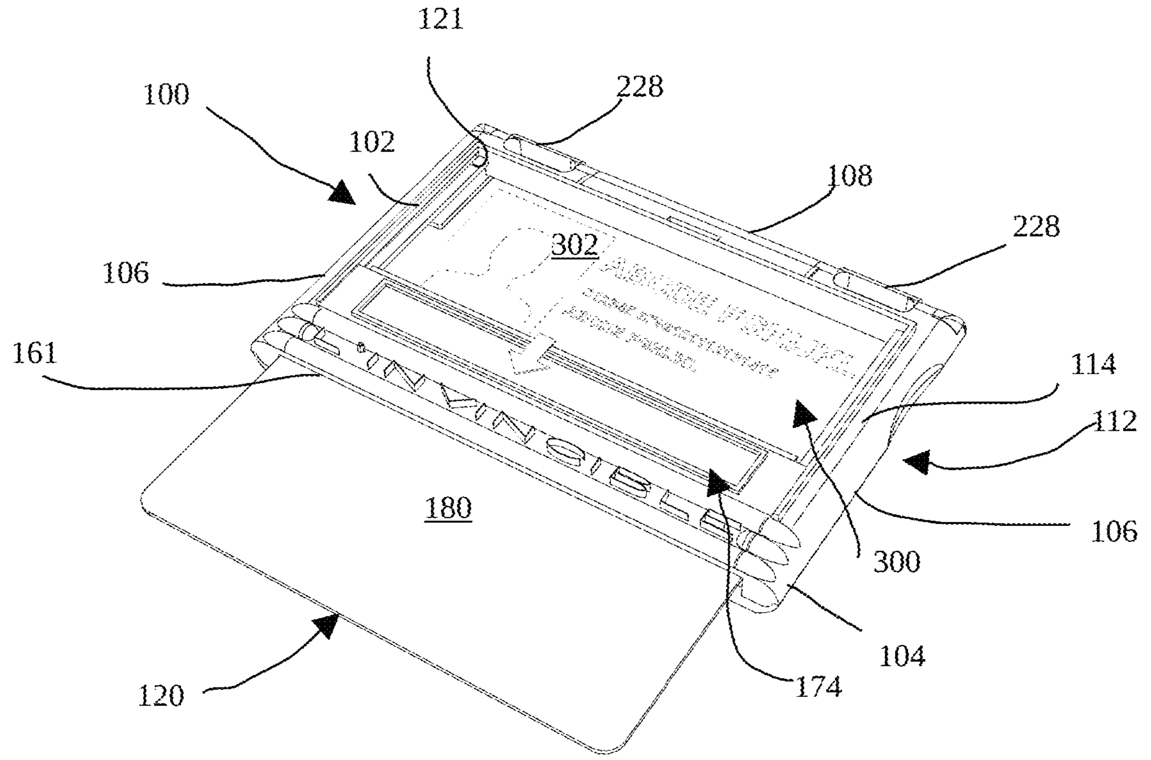
FIG. 2, in a front perspective view, illustrates the card holder in FIG. 1, here shown in a card showing configuration.

The front cover 120 is movable between a card hiding configuration, seen in FIG. 1 for example, wherein the front aperture 121 is covered by the front cover 120 to obstruct from view the card front face 302, and a card showing configuration, seen in FIG. 2 for example, wherein the front cover 120 is retracted from at least part of the front aperture 121 to at least partially show the card front face 302. While other types of front cover are possible, in some embodiments, front cover 120 is slidable across the front aperture 121 when moving between the card hiding and showing configurations. In other embodiments (not shown in the drawings), the front cover 120 may pivot relative to the casing 112 or be simply removable therefrom to achieve the card showing configuration.

Figure 3:
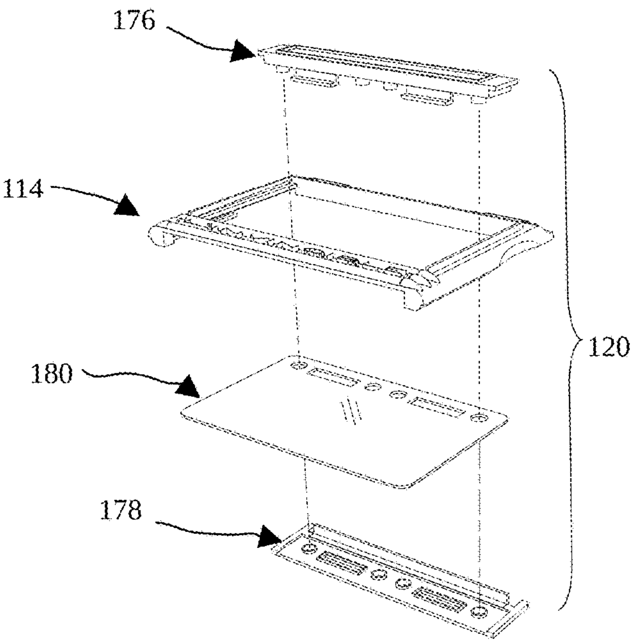
FIG. 3, in a perspective, exploded view, illustrates a front cover part of the card holder of FIG. 1.

Referring collectively to FIGS. 2 and 3, the front cover 120 generally includes a carriage component 174, which includes a carriage component front cover 176 and a carriage component rear cover 178, and a front cover plate 180 having a top edge portion 182 thereof engaged between the carriage component front and rear covers 176 and 178 of the carriage component 174.

Referring to FIGS. 20 to 26 inclusively, the carriage component rear cover 178 has a substantially rectangular and planar configuration defining a carriage component rear cover outer side 184, an opposed carriage component rear cover inner side 186, and opposed carriage component rear cover top, bottom and lateral side edges 188, 190, and 192 respectively. The carriage component rear cover 178 further defines a plurality, but typically four (4) carriage component cover bores 194 located in a spaced apart relation along the lateral width of the carriage component rear cover 178, and extending transversally throughout the thickness thereof. The carriage component rear cover 178 further defines two (2) elongated carriage component cover slots 196 extending collinearly in a spaced apart relationship along the lateral width of the carriage component rear cover 178, and extending throughout the thickness thereof. The carriage component rear cover 178 further defines an elongated ledge 198 extending parallelly along substantially the whole lateral width of the top edge of the carriage component rear cover inner side 186, and at least partially frontwardly thereof. The carriage component rear cover 178 further defines a pair of carriage component rear cover engaging side edges 200 extending parallelly longitudinally along a respective one of the lateral side edge of the carriage component rear cover 178.

Referring to FIGS. 13 to 19 inclusively, the carriage component front cover 176 has a substantially equivalently dimensioned rectangular and planar configuration as the carriage component rear cover 178. Likewise the carriage component rear cover 178, the carriage component front cover 176 defines a carriage component front cover outer side 202, an opposed carriage component front cover inner side 204, and opposed carriage component front cover top, bottom and lateral side edges 206, 208 and 210 respectively. The carriage component front cover 176 further defines a plurality of carriage component cover protrusions 212 along the carriage component front cover inner side 204 that are in corresponding number, compatibly shaped, sized and positioned for engaging in a press-fit relation the carriage component cover bores 194 of the carriage component rear cover 178. The carriage component front cover 176 further defines two (2) elongated carriage component front cover engaging ledges 214 extending collinearly in a spaced apart relationship along the carriage component front cover inner side 204. Each carriage component front cover engaging ledge 214 have a substantially L-shaped cross-section extending at least partially distally and coplanarly towards the bottom edges of the carriage component front cover inner side 204. Each front cover engaging ledge 214 is suitably shaped and sized for engaging in a hook-like arrangement a respective one of the carriage component cover slots 196, so as to prevent the carriage component front cover 176 from being pulled away from the carriage component rear cover 178 of the carriage component 174. The carriage component front cover 176 further defines a pair of carriage component front cover engaging side edges 216 extending parallelly longitudinally along a respective one of the lateral side edge of the carriage component front cover 176.

Referring collectively to FIGS. 3, and 5 to 8, the front cover plate 180 has a substantially rectangular planar and thin walled configuration defining a front cover plate front side 218 oriented frontwardly relative to the card holder 100, an opposed front cover plate rear side 220 oriented rearwardly thereof, and a front cover plate top edge portion 182.

The front cover plate 180 is suitably dimensioned such that, when coplanarly positioned against the carriage component front cover inner side 204, the laterally extending top and bottom edges thereof extend laterally parallelly in register with the laterally extending inner side of the top frame segment, and the laterally extending bottom edge of the bottom frame segment, of the casing front frame 114. Furthermore, the opposed lateral side edge of the front cover plate 180 are sufficiently parallelly spaced apart relative to one another so as to parallelly coplanarly engage a frontward longitudinal side of a respective one of the casing front frame inner lateral side edges 158 of the casing front frame 114.

The front cover plate 180 further defines a plurality of carriage component engaging apertures 222 along the front cover plate top edge portion 182. Each carriage component engaging apertures 222 is suitably shaped, sized and positioned so as receive there through in a snug fit relation a correspondingly shaped and positioned one of the front cover engaging protrusions 212 or front cover engaging ledge 214 of the carriage component front cover 176.

Referring to FIG. 3, the carriage component front and rear covers 176, 178, and front cover plate 180 are cooperatively suitably shaped and dimensioned such that, with the front cover plate 180 coplanarly positioned against the pair of casing front frame inner lateral side edges 158, the carriage component rear cover 178 may be positioned coplanarly in register against the front cover plate top edge portion 182, followed with engaging the protrusions 212 and front cover engaging ledges 214 of the carriage component front cover 176 through the corresponding apertures of the front cover plate 180 and the carriage component rear cover 178 respectively.

Furthermore, with the carriage component 174 thus assembled and engaged along the front cover plate top edge portion 182, the parallelly disposed carriage component front and rear cover engaging ledges 154 are concurrently slidably engaged coplanarly on opposed sides of the casing front frame inner lateral side edges 158 of the casing front frame 114. Thus, the front cover 120 is user selectively slidably movable away and towards the top edge of the casing 112, so as to move the front cover 120 between a closed position, to achieve the card hiding configuration, as illustrated in FIG. 1, and an open position, to achieve the card showing configuration, as illustrated in FIG. 2, respectively.

In the card hiding configuration, the front cover 120 is fully contained within the footprint of the casing 112. In the card showing configuration, the front cover protrudes from the casing 112 through the cover slit 161. Movement between the card showing and card hiding configurations is performed by sliding the carriage component 174 along the casing 112 in a direction perpendicular to the cover slit 161.

Referring to FIGS. 1 to 4, and 51 to 54 collectively, a method of securely engaging an information card 300 within the assembly of the card holder 100 will now be described. The following method of assembly considers as preassembled the front cover 120 on the casing front frame 114, as illustrated in FIG. 3, and the rear cover plate 118 engaged within the casing rear frame 116, as illustrated in FIG. 4, since their method of assembly have been described further above.

In a first step, position the casing rear frame 116 and rear cover plate 118 assembly such that its inner side 124 is facing substantially upwardly, as illustrated in FIG. 4.

In a second step, with the information card 300 facing upwardly, insert the latter under the plurality of card engaging ledge segments 134 so as to coplanarly contact the front surface of the rear cover plate 118 and have the top edge of the information card 300 parallelly contacting the inner top edge of the rear frame window aperture 126.

In a third step, position the assembly of the casing front frame 114 and front cover 120 such that a top half of the casing front frame inner side 144 is coplanarly contacting in register a bottom half of the casing rear frame inner side 124.

In a fourth step, coplanarly slide the assembly of the casing front frame 114 and front cover 120 towards the top edge of the casing rear frame 116 until the corner recesses 152 of the casing front frame 114 contactingly abuts against the cover engaging protrusions 138 of the casing rear frame 116.

In a fifth step, as illustrated in FIG. 53, engage the pair of locking C-clips 160 in the pair of clip engaging grooves 162 respectively, so as to lockingly engage the casing front and rear frames 114 and 116.

With the information card 300 thus securely engaged and protected within the assembly of the card holder 100, the owner of the card holder 100 may selectively move the carriage component 174 towards or away relative to the casing bottom edge 110 in order to correspondingly move the front cover 120 between the open and close positions of the card holder 100. It should be noted that in some embodiments, the card holder 100 includes a single card receiving portion 123 in the casing 112 configured for receiving a single card 300 thereinto. The purpose of the card holder 100 is then not to serve as a wallet, but to serve as a secure container for the information card 300.

Figure 55:
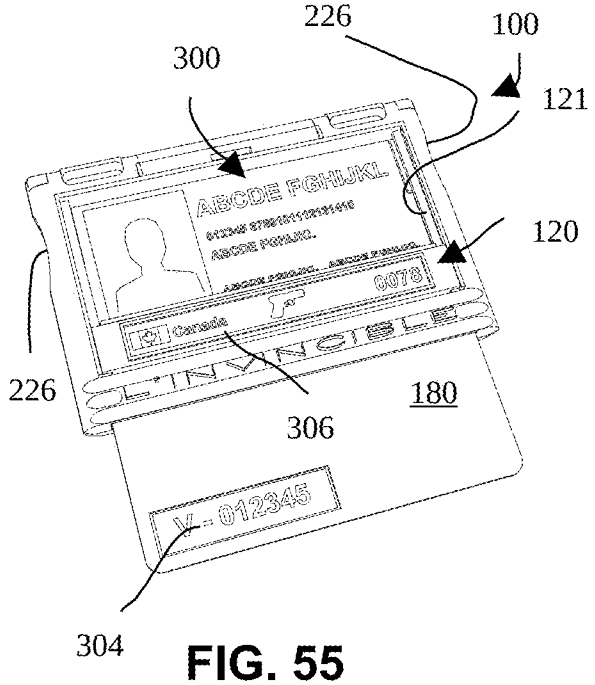
FIG. 55, in a front perspective view, illustrates a variant of the card holder of FIG. 1.

Hence, as illustrated in FIGS. 1, 2 and 55, the owner can selectively show or hide the information on the front side of the information card 300 or, concurrently, show or hide the indicia 306 along the lower front edge of the front cover plate 180 located on a concealable area 181 of the front cover 120. Indeed, in the card hiding configuration, the concealable area 181 is hidden inside the casing 112, as it is in register with the casing front frame 114, and in the card showing configuration, the concealable area 181 protrudes from the casing, through the cover slit 161.

Figure 57:
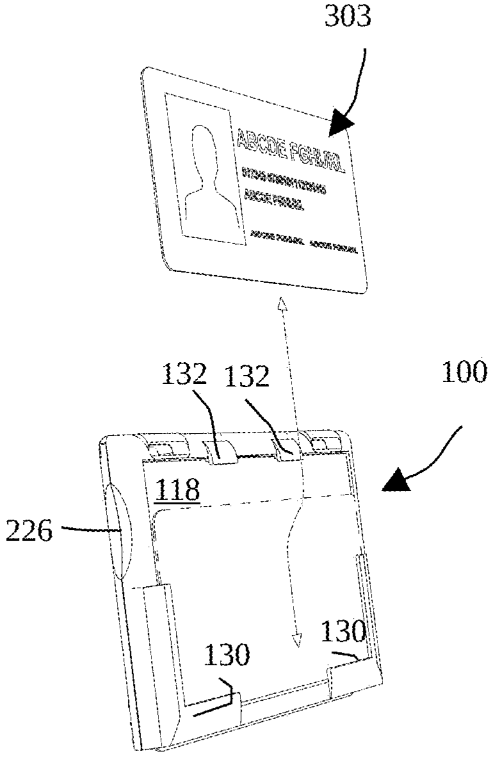
FIG. 57, in an exploded rear perspective view, illustrates a variant of the card holder of FIG. 55.

In some embodiments of the invention, as exemplified in FIG. 57, the card holder 100 further inherently comprises a card engaging arrangement configured for slidably engaging therein in a snug fit relation an additional standard size card 303 along the casing rear frame outer side 122 described further above. The additional standard size card 303 may be, for example, a card that is frequently used daily by the user of the card holder 100.

This card engaging arrangement is cooperatively formed out of the pair of casing rear frame bottom contour edges 130 and the parallelly extending rear surface of the rear cover plate 118, which allow the insertion of the card 303 in a friction restraint there between.

As best illustrated in FIG. 57, the assembled casing 112 may further define opposed thumb recesses 226 defined along an upper end portion of the opposed lateral edges thereof.

Figure 56:
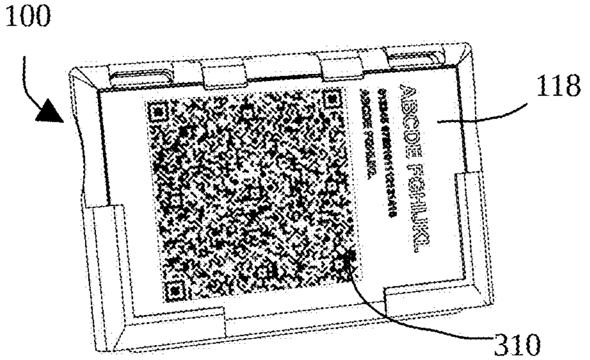
FIG. 56, in a rear perspective view, illustrates the card holder of FIG. 55.
Figure 58:
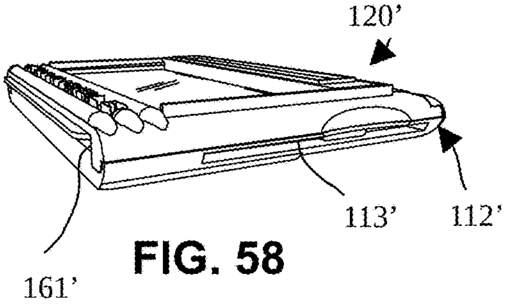
FIG. 58, in a perspective view, illustrates a card holder in accordance with another embodiment of the present invention.

As best illustrated in FIGS. 55 and 56, the assembled casing 112 may further define a pair of attachment clip engaging apertures 228 extending throughout and adjacently the opposed ends, respectively, of the top edge thereof.

In some embodiments of the invention, as exemplified in FIG. 55, the front cover 120 may further include one or more user selectively concealable information indicia 304 located along a front side lower edge portion of the front cover plate 180. Such user selectively concealable information indicia 304 may be, for example, a personalized recall vaccine dose identifier or number, a serial code, or the likes. The user selectively concealed information indicia 304 are suitably sized and located along the lower edge portion of the front cover plate 180 so as to be concealed from view behind the lower front edge 150 of the casing front frame 114 when the front cover 120 is in the closed position, and visually accessible below the casing 112 when the front cover 120 is in the open position.

In some embodiments, the user selectively concealable information indicia 304 are printed on, or integrated in, non-removable self-adhesive labels applied along the bottom surface of a suitably sized shallow relief or cavity defined in the front surface of the front cover plate 180. The shallow relief or cavity may have a depth dimension that is sufficient for receiving multiple non-removable self-adhesive labels layered one on top of the other such as, for example, self-adhesive labels indicating a confirmed number of recall vaccine doses received to date by the owner of the card holder 100.

In the embodiments of the casing 112 that include an "opaque" rear cover plate 118, more surface space is available along a major lower portion of the rear side of the front cover plate 180 for adding user selectively concealable information indicia 304. This optional aspect of the invention may be convenient when one or more private information must be shown separately from the one(s) present on the front side of the front cover plate 180.

External, or visually accessible information indicia 306 may be applied along the front surface of the carriage component 174. As exemplified in FIG. 55, such visually accessible information indicia 306 may be represented by a nationality flag, a symbol indicating that user wears a registered firearm, a registered ID or serial number, or the likes.

Here again, the visually accessible information indicia 306 are represented for example by non-removable self-adhesive labels applied along the bottom surface of a suitably sized surface cavity defined in the front surface of the carriage component 174.

Figure 16:
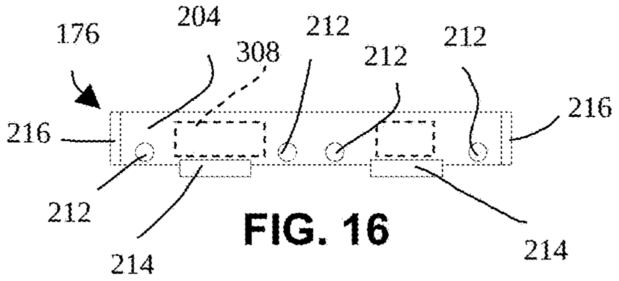
FIG. 16, in a rear elevational view, illustrates the carriage component front cover.
Figure 17:
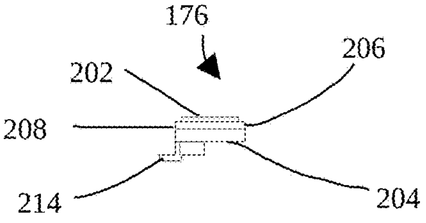
FIG. 17, in a side elevational view, illustrates the carriage component front cover.
Figure 18:
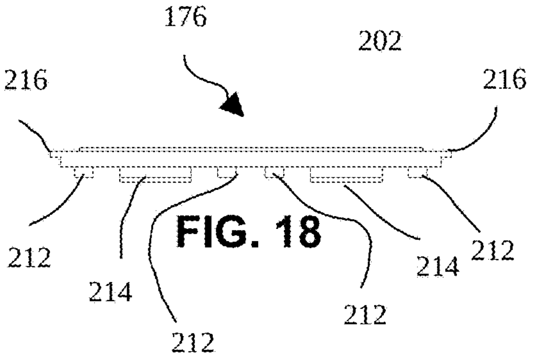
FIG. 18, in a top elevational view, illustrates the carriage component front cover.
Figure 19:
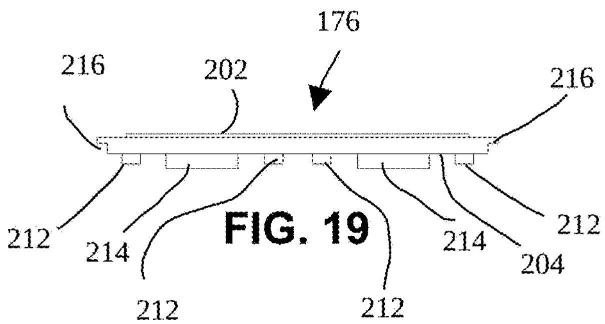
FIG. 19, in a bottom elevational view, illustrates the carriage component front cover.
Figure 20:
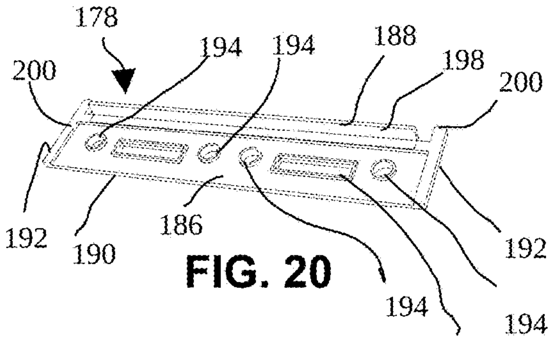
FIG. 20, in a front perspective view, illustrates a carriage component rear cover part of the front cover of FIG. 3.
Figure 21:
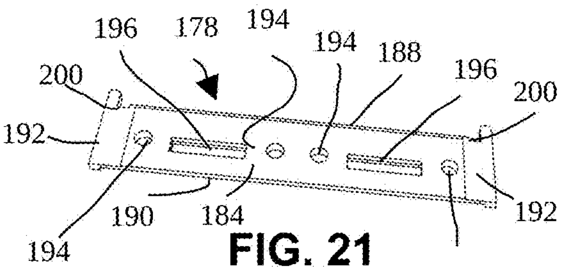
FIG. 21, in a rear perspective view, illustrates the carriage component rear cover.
Figure 22:
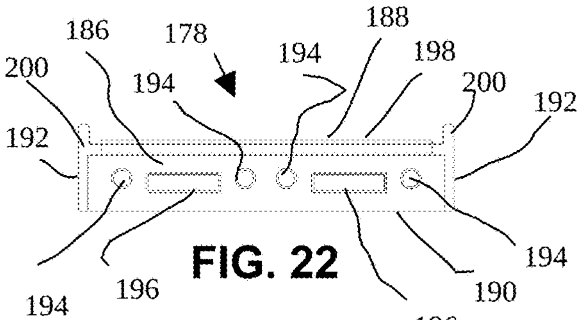
FIG. 22, in a front elevational view, illustrates the carriage component rear cover.
Figure 23:
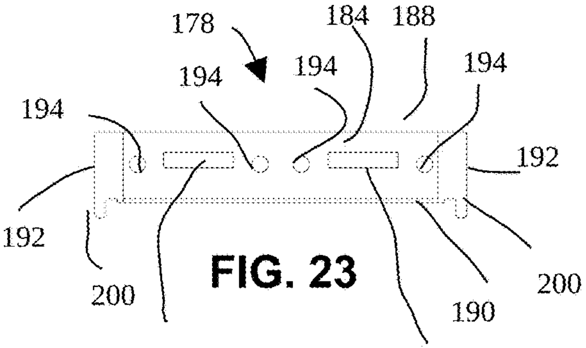
FIG. 23, in a rear elevational view, illustrates the carriage component rear cover.
Figure 24:
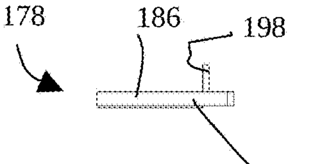
FIG. 24, in a side elevational view, illustrates the carriage component rear cover.
Figure 25:
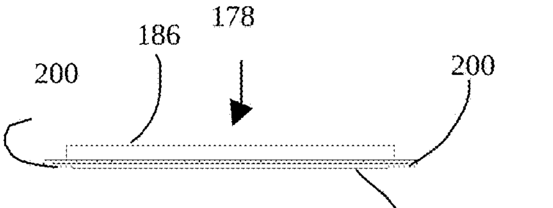
FIG. 25, in a top elevational view, illustrates the carriage component rear cover.
Figure 26:
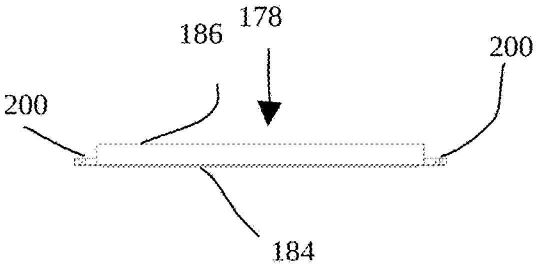
FIG. 26, in a bottom elevational view, illustrates the carriage component rear cover.
Figure 27:
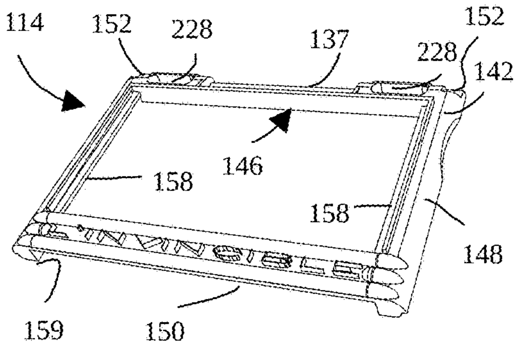
FIG. 27, in a front perspective view, illustrates a casing front frame part of the card holder of FIG. 1.
Figure 28:
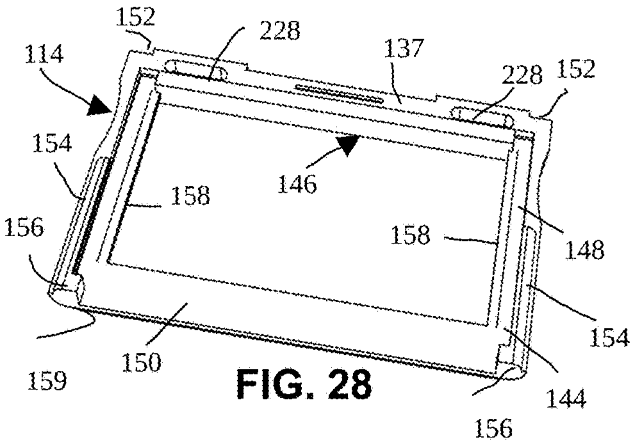
FIG. 28, in a rear perspective view, illustrates the casing front frame.
Figure 29:
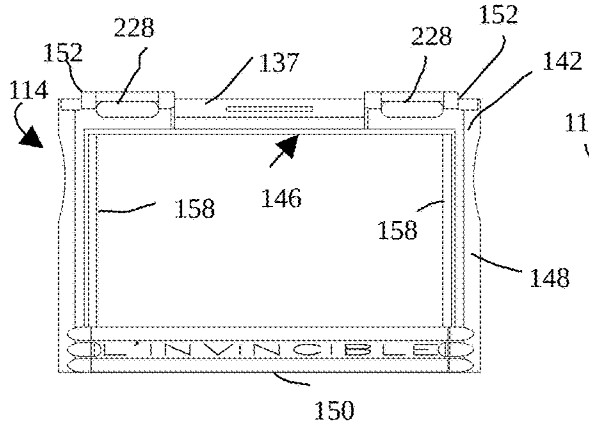
FIG. 29, in a front elevational view, illustrates the casing front frame.
Figure 30:
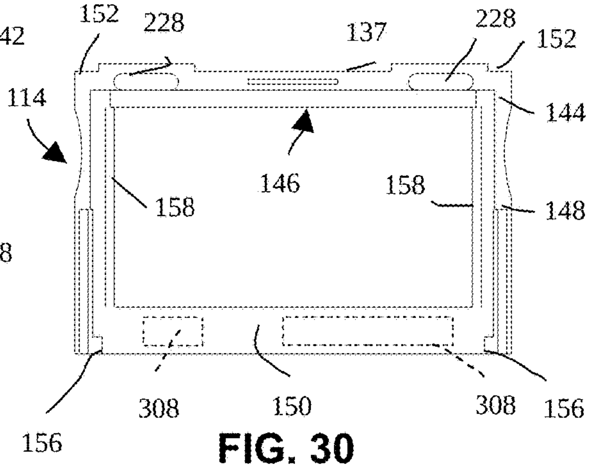
FIG. 30, in a rear elevational view, illustrates the casing front frame.
Figure 31:
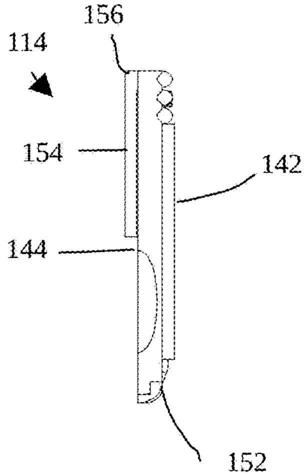
FIG. 31, in a side elevational view, illustrates the casing front frame.
Figure 32:
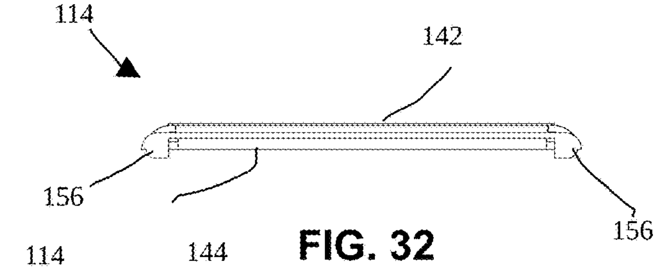
FIG. 32, in a top elevational view, illustrates the casing front frame.
Figure 33:
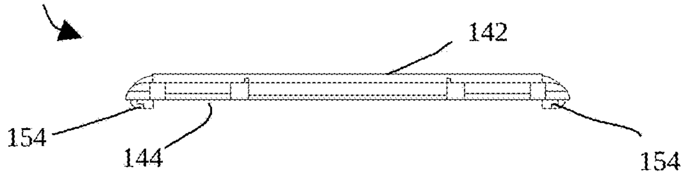
FIG. 33, in a bottom elevational view, illustrates the casing front frame.
Figure 34:
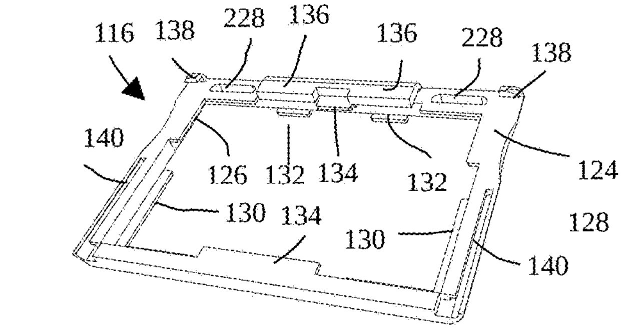
FIG. 34, in a front perspective view, illustrates a casing rear frame part of the card holder of FIG. 1.
Figure 35:
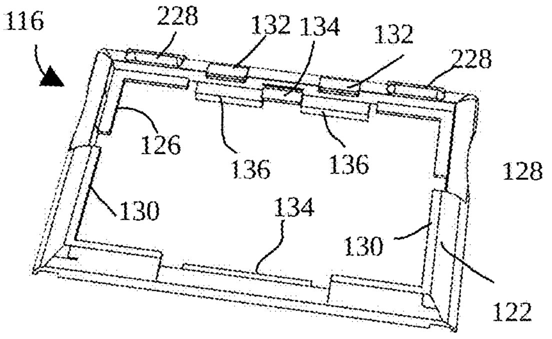
FIG. 35, in a rear perspective view, illustrates the casing rear frame.
Figure 36:
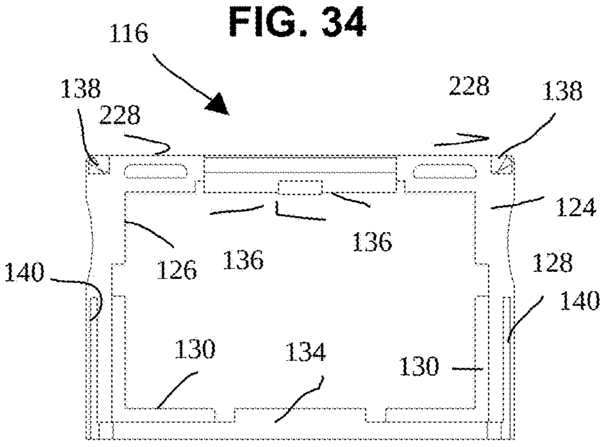
FIG. 36, in a front elevational view, illustrates the casing rear frame.
Figure 37:
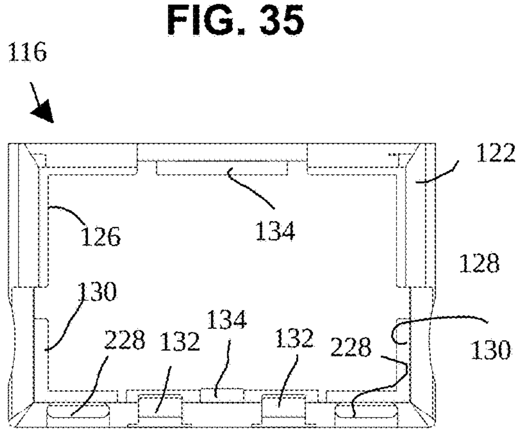
FIG. 37, in a rear elevational view, illustrates the casing rear frame.
Figure 38:
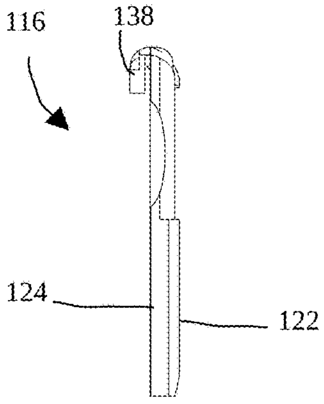
FIG. 38, in a side elevational view, illustrates the casing rear frame.
Figure 39:
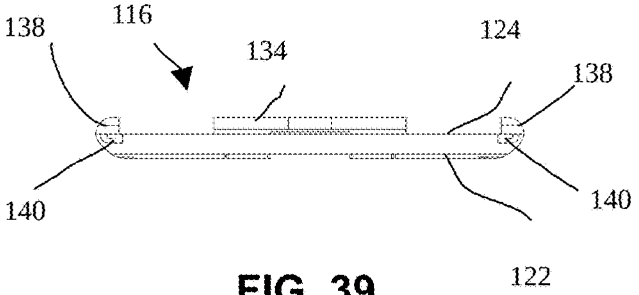
FIG. 39, in a top elevational view, illustrates the casing rear frame.
Figure 40:
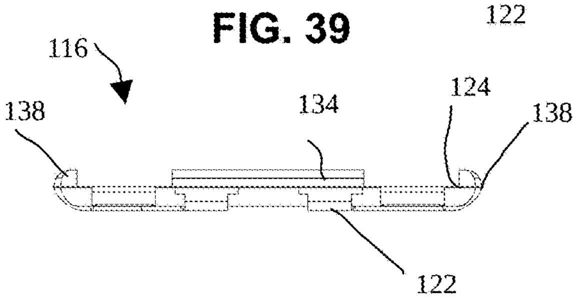
FIG. 40, in a bottom elevational view, illustrates the casing rear frame.
Figure 41:
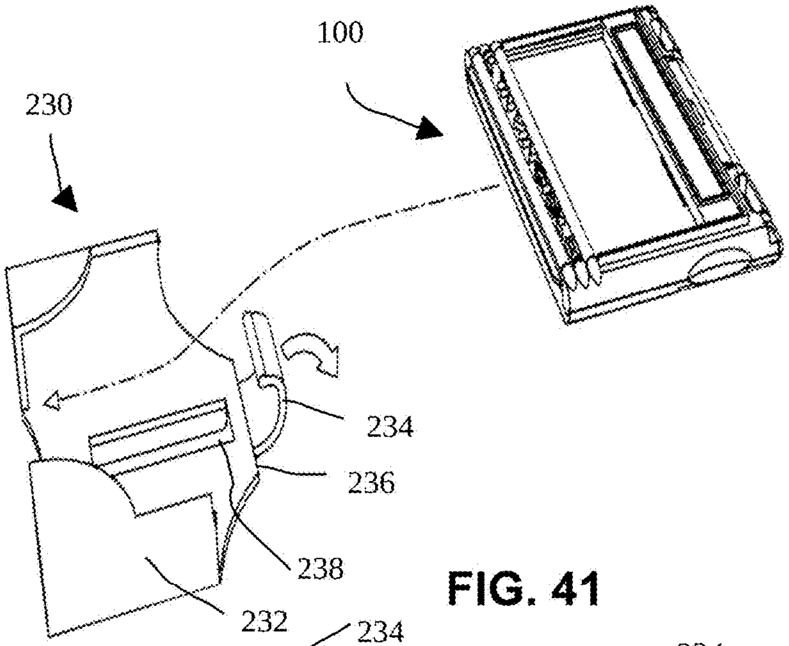
FIG. 41, in a front perspective view, illustrates the card holder in FIG. 1 and a belt holster case usable to carry the card holder.

In some embodiments of the invention, as exemplified in FIGS. 16 and 30, the card holder 100 may further comprise, for example, one or more wirelessly accessible technologies 308 such as, but not limited to, an RFID microchip, an embedded geolocalization microchip technology similar to the recently marketed AirTag® by Apple Inc., or the likes. For example, wirelessly accessible technologies 308 includes a wirelessly accessible element including information accessible through a wireless communication protocol.

Likewise the user selectively concealable information indicia 304 described further above, these one or more wirelessly accessible technologies 308 may be represented by relatively thin wafer-like microchips embedded in suitably sized shallow relief or cavity defined along selected interior surface portions of, for example, the carriage component front cover 176 and/or of the casing front frame 114. Alternatively or concurrently, these various wirelessly accessible technologies 308 may be embedded within the structural material of these covers.

These technologies may be used, for example, as an authenticity confirmation of the card holder 100, a wirelessly updated number of recall vaccine doses received by the owner of the card holder 100, the geographical position of the card holder 100, or other similar wirelessly accessible data and functions, depending on the technology involved.

As exemplified in FIG. 56, the rear surface of the rear cover plate 118 can be used to apply there on a self-adhesive label 310 for displaying, for example, an updated QR Code indicating the last recall vaccine dose received by the owner of the card holder 100, as is compulsory to show before entering any public venues in many countries around the world during a virus epidemic such as COVID-19.

In some embodiments of the invention, there may also be provided with a belt clip holster case 230 suitably configured for conveniently carrying in a secure manner the card holder 100. As exemplified in FIGS. 41 to 49 inclusively, the belt clip holster case 230 includes a holster case open casing 232 configured for receiving and covering in a snug fit relation opposed lower corner portions, opposed side edge portions, and a major portion of the casing rear side, of the card holder 100.

Figure 42:
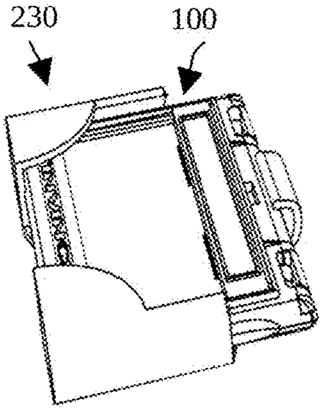
FIG. 42, in a front perspective view, illustrates the card holder in FIG. 1 inserted and secured in the belt holster case of FIG. 41.
Figure 43:
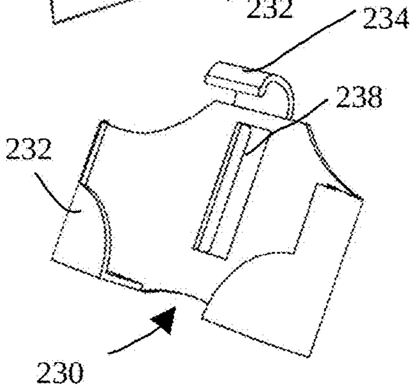
FIG. 43, in a front perspective view, illustrates the belt holster case of FIG. 41.
Figure 44:
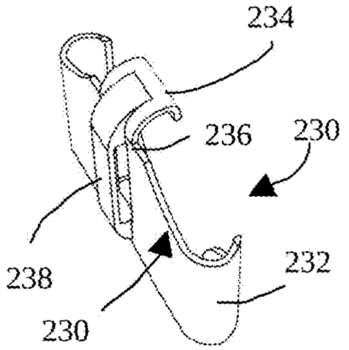
FIG. 44, in a rear perspective view, illustrates the belt holster case of FIG. 41.
Figure 45:
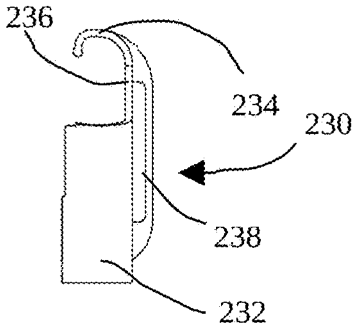
FIG. 45, in a side elevational view, illustrates the belt holster case of FIG. 41.
Figure 46:
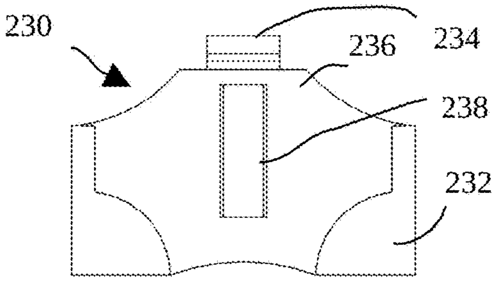
FIG. 46, in a front elevational view, illustrates the belt holster case of FIG. 41.
Figure 47:
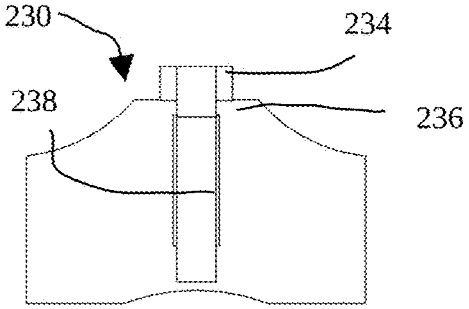
FIG. 47, in a rear elevational view, illustrates the belt holster case of FIG. 41.
Figure 48:
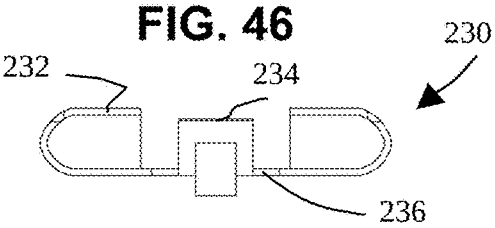
FIG. 48, in a top elevational view, illustrates the belt holster case of FIG. 41.
Figure 49:
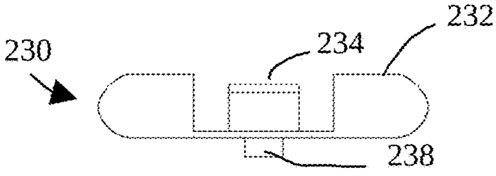
FIG. 49, in a bottom elevational view, illustrates the belt holster case of FIG. 41.
Figure 50:
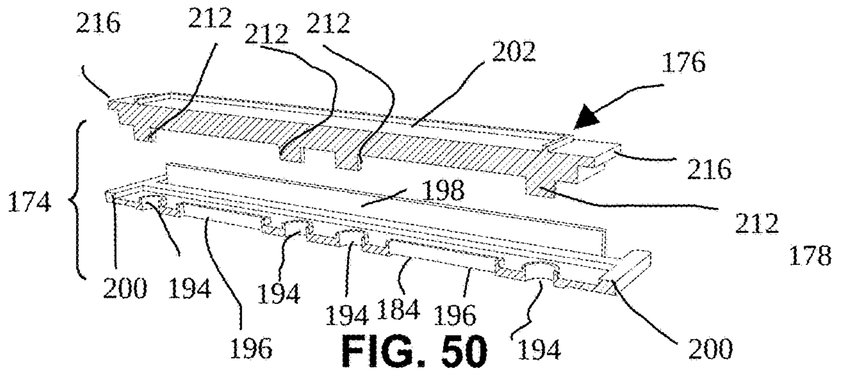
FIG. 50, in an exploded bottom perspective, cut away view, illustrates the assembly of the carriage component front cover with the carriage component rear cover.
Figure 51:
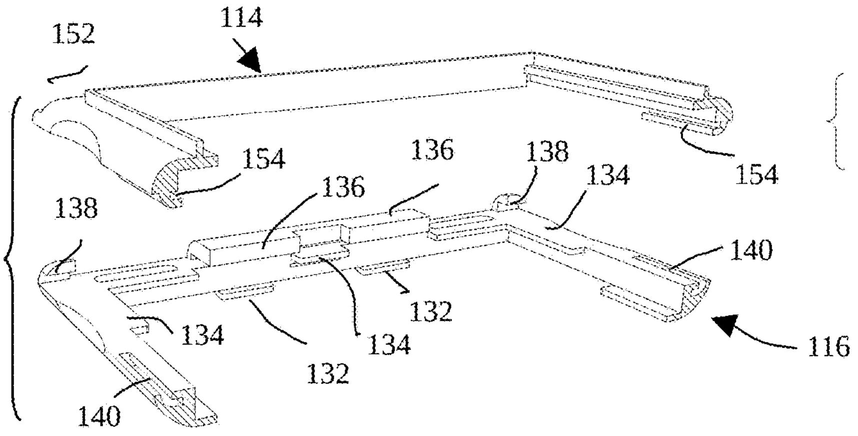
FIG. 51, in an exploded bottom perspective, cut away view, illustrates the assembly of a casing front frame with a casing rear frame.
Figure 52:
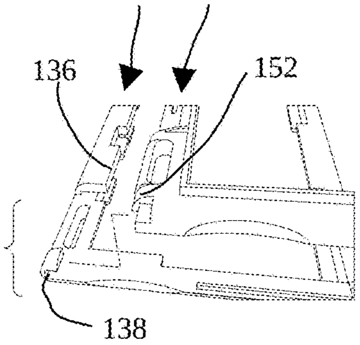
FIG. 52, in an exploded side perspective, cut away view, illustrates the assembly of a top end corner of casing front frame with the casing rear frame.

The belt clip holster case 230 further includes a restraint hook 234. The restraint hook 234 includes a lower end connected centrally along an upper edge portion of a rear wall 236 of the open casing 112, and extends substantially upwardly and forwardly therefrom so as proximally contour at least partially a centred upper edge portion of the card holder 100 once snugly engaged in the open casing 23, as illustrated in FIG. 42. The restraint hook 234 is typically made of a suitably resilient material that is sufficiently flexible to allow a user to bend rearwardly the latter with a finger, in order to freely insert the card holder 100 into the open casing 232, but without the use of an excessive force, yet rigid enough to securely maintain the card holder 100 in the open casing 112.

The belt clip holster case 230 further includes a belt clip loop 238 or equivalent connected along a centred rear surface portion of the rear wall of the open casing 112, for securely engaging therein a waist belt, a shoulder strap of a hand bag, of a sport bag, or a backpack, or the likes.

The casing front and rear frames 114 and 116, and the carriage component front and rear covers 176, 178, respectively, are made of a substantially rigid material such as, but not limited to, moulded or 3D printed plastic, aluminum, a light metal alloy, or the likes. Typically, theses components of the card holder 100 are made of a sufficiently rigid plastic material so as to allow wirelessly accessible technologies 308, such as RFID and geolocalization technologies described further above, to be embedded in the casing 112 and communicate remotely with an external computer device, smartphone, or the likes.

FIGS. 58 to 67 collectively illustrates an alternative card holder 100'. This alternative card holder 100' is similar to the card holder 100 described hereinabove, and the similar characteristics will therefore not be described in detail. One difference between the card holders 100 and 100' is that the card holder 100' can be moved to a card protruding configuration, seen for example in FIGS. 64, 66 and 67 in which part of the information card 300 protrudes from a card slit outside of the casing 112'.

To that effect, the casing 112' defines a card slit 113' positioned adjacent the card receiving portion 123'. The card slit 113' and the card receiving portion 123' are operatively coupled to each other to allow selective passage of at least part of the information card 300 from the card receiving portion 123' and through the card slit 113', so that the information card 300 at least partially protrudes from the casing 112'. To that effect, the casing 112' is free of obstruction between the card receiving portion 123' and the card slit 113', so that the information card 300 can slide between the card receiving portion 123' and the card slit 113'.

The card slit 113' is in some embodiments perpendicular to the cover slit 161', and positioned to the right of the casing 112' when the latter is viewed from the front with the front cover 120' sliding towards a user looking at the information card 300. This is convenient as this allows one to push out of the casing 112' a machine readable element, such a credit card microchip 310, usually provided on the right hand side of information cards 300 when the latter are viewed so as to read any information shown on their card front face 302, all the while conveniently showing this information with the front cover 120' in the open position. In other embodiments, the card slit 113' is positioned at any other suitable location along the casing 112', and more than one card slit 113' may be provided. For example, two card slits 113' are provided opposed to each other, to allow movements of the information card 300 to either side of the casing 112'.

In some embodiments, the casing 112', and more particularly the card holding members thereof, is configured so that a typical information card 300 of standard thickness slightly frictionally engages the casing 112' so that the information card 300 requires a small force to move through the card slit 113', so that the information card cannot fall accidentally from the casing 112'.

In some embodiments, the information card 300 can be pushed out of the casing 112' through the card slit 113'. However, in some embodiments, it would be beneficial to lock the information card 300 in the casing 112' so that the information card 300 cannot be simply pushed out of the card slit 113'. In such embodiments, when coupled to a tamper-proof casing that cannot be opened without leaving visible traces, authenticity of the information card 300 can be trusted as the information card 300 cannot be replaced with an alternative card without leaving visible traces. The casing 112' can be made tamper-proof for example by locking the casing front and rear frames 114 and 116 to each other through the engagement of hidden tabs with protruding portions in suitably located recessed, or by holding the casing assembly using a strong adhesive or any other suitable link that is very difficult, if not impossible, to break without destroying the casing 112'.

One manner of locking the information card 300 in the casing is to use a card handler 125' for holding the information card 300. The card handler 125' is a member too large to enter the card slit 300' and mounted to the casing 112' in register with the front aperture 121' so as to be movable therealong in a direction substantially perpendicular to the card slot 113'. The information card 300 is mounted to the card handler 125' opposed to the machine readable element 310. For example, the identification card simply engage frictionally a slit provided in the card handler 125'. In other embodiments, the card handler 125' includes pins or other elements that engage the identification card 300 through suitable apertures extending therethrough. In yet other embodiments, an adhesive is used to mount the information card 300 to the card handler 125'. The card handler 125' is movable between card handler retracted and extended configurations, seen respectively in FIGS. 63 and 64. The card handler 125' is closer to the card slit 113' in the card handler extended configuration than in the card handler retracted configuration. The card handler 125' may be mounted to the casing 112' similarly to the manner the carriage component 174 is mounted to the casing 112', by engaging suitable formed grooves formed in the casing adjacent the front aperture 121' allowing slidable movements of the card handler 125' along the casing 112'.

Figure 59:
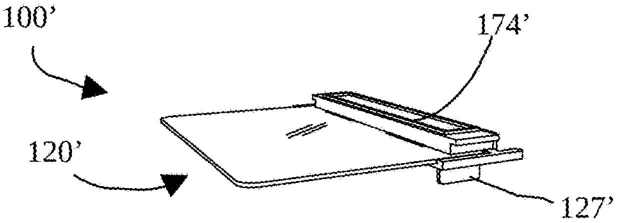
FIG. 59, in a perspective view, illustrates the front cover of the card holder of FIG. 58.
Figure 60:
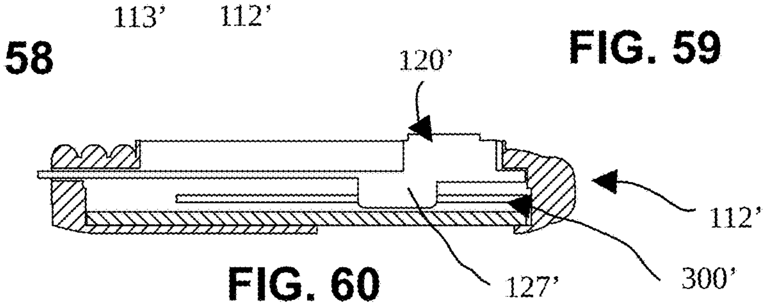
FIG. 60, in a side cross-sectional view, illustrates the card holder of FIG. 58, the cross-section being taken perpendicular to a cover slit of the card holder at the level of a stopper part of the front cover, the card holder being shown in a card hiding configuration.
Figure 61:
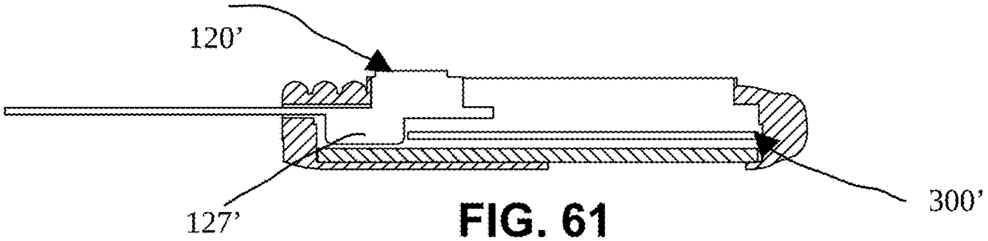
FIG. 61, in a side cross-sectional view taken along the same section line as FIG. 60, illustrates the card holder of FIG. 58 in a card showing configuration.
Figure 62:
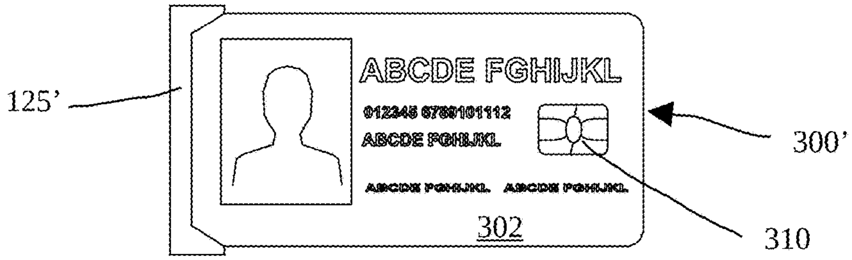
FIG. 62, in a top elevation view, illustrates an identification card held by a card handler part of the card holder of FIG. 58.
Figure 63:
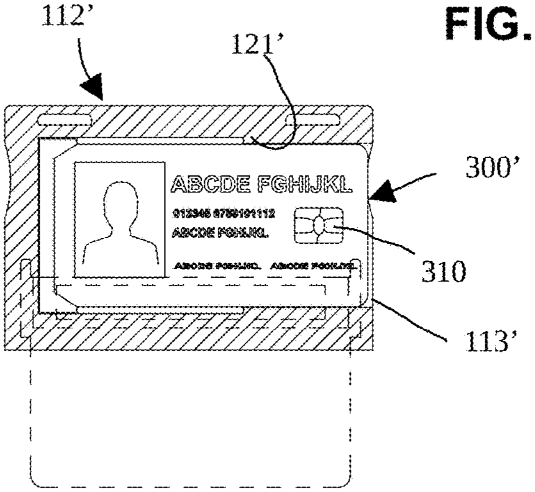
FIG. 63, in a top cross-sectional view, illustrates the card holder of FIG. 58 with the card handler in a card handler retracted configuration.
Figure 64:
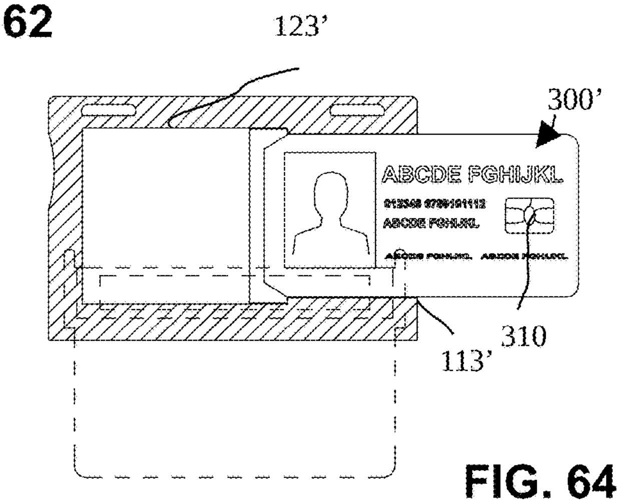
FIG. 64, in a top cross-sectional view, illustrates the card holder of FIG. 58 with the card handler in a card handler extended configuration.

In some embodiments, the card holder 100' includes a stopper 127' movable between an obstructing position, seen for example in FIG. 60, and a released position, seen for example in FIG. 61. In the obstructing position, the stopper 127' is between the card receiving portion 123' and the card slit 113' to prevent the information card 300 from moving from the card receiving portion 123' to the card slit 113'. In the released position, the stopper 127' is retracted from the card receiving portion 123'. In some embodiments, the stopper 127' is a member that is independently movable along the casing 112'. In other embodiments, the stopper 127' is defined by the carriage component 174', as seen in FIG. 59 for example, in the form of a protrusion that protrudes from the carriage component 174' towards the rear of the casing 112'. A suitable stopper groove 129' is formed in the casing 112' to allow movements of the stopper 127' therealong. The stopper is relatively small, so that when the front cover 120' is fully open, the stopper 127' has cleared the card slit 113'. Thus, the stopper is between the card receiving portion 123' and the card slit 113' in the card hiding configuration, and the stopper 127' is withdrawn from the card receiving portion 123' in the card showing configuration to allow selective movement of at least part of the information card 300 from the card receiving 123' portion through the card slit. Thus, the information card 300 is prevented from protruding through the card slit 113' when the front cover 120' obstructs the front aperture 121'. While the stopper 127' is shown in the drawings as used in combination with the card handler 125', in alternative embodiments, the stopper 127' is used while the card handler 125' is omitted.

Figure 65:
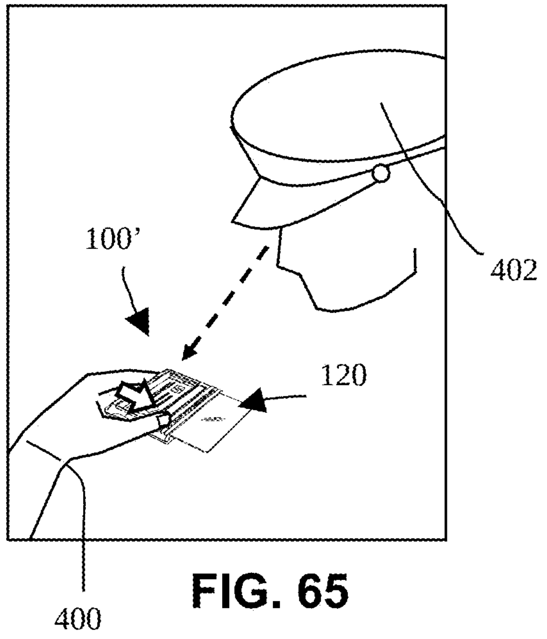
FIG. 65, in a perspective environmental view, illustrates the card holder of FIG. 58 in the card showing configuration.
Figure 66:
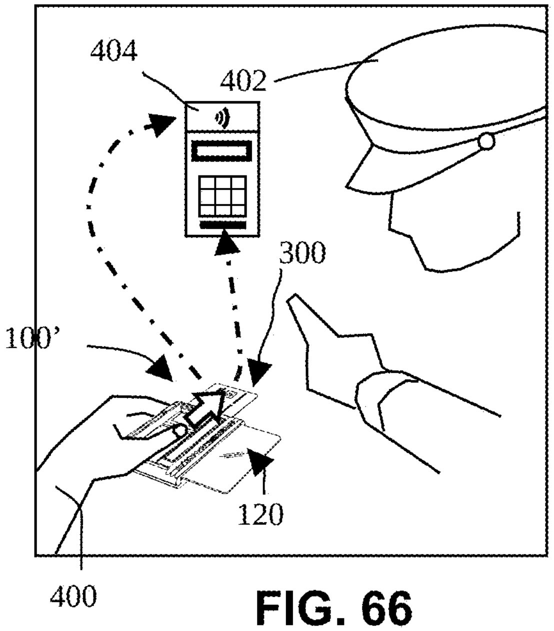
FIG. 66, in a perspective environmental view, illustrates the card holder of FIG. 58 in a card protruding configuration.
Figure 67:
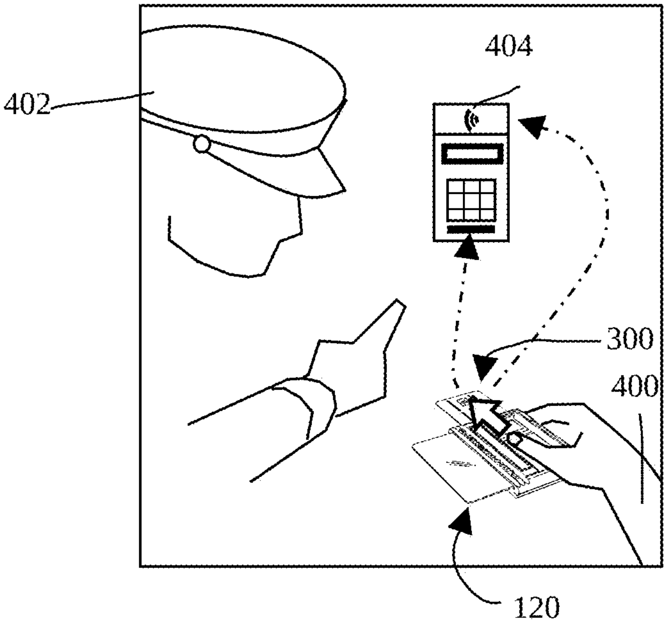
FIG. 67, in another perspective environmental view, illustrates the card holder of FIG. 58 in an alternative card protruding configuration.

FIGS. 65 and 66 illustrate an example of use of the card holder 100', for example at a high security facility. First, an intended user 400 of the card holder 100' shows the information carried visually on the information card 300 to security personnel 402 by moving the card holder 100' to the card showing configuration. This information may for example include a photograph of the intended user, allowing visual confirmation by the security personnel 402 that the person showing up with the information card 300 is indeed the person associated with the information card 300. Then, the intended user 400 can move the card holder 100' to the card protruding configuration to allow reading by a card reader 404 of the readable element 310. For example the information read by the card reader may indicate which sections of a complex should be accessible to the intended user 400, or specific time periods during which access should be granted to the intended user 400, among other possibilities. A seen in FIG. 67, in some embodiments, the card holder is provided with a second card slit 113' opposed to the first card slit 113' to allow the information card 300 to protrude in the opposed direction, which may be more convenient for a left-handed person.

Figure 68:
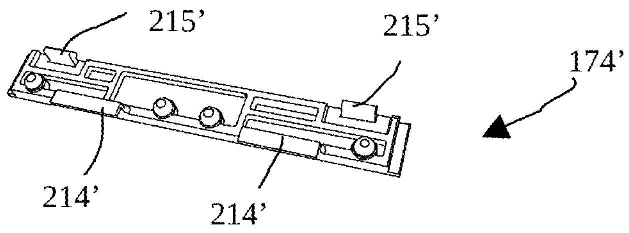
FIG. 68, in a perspective view, illustrates an alternative carriage component front cover.
Figure 69:
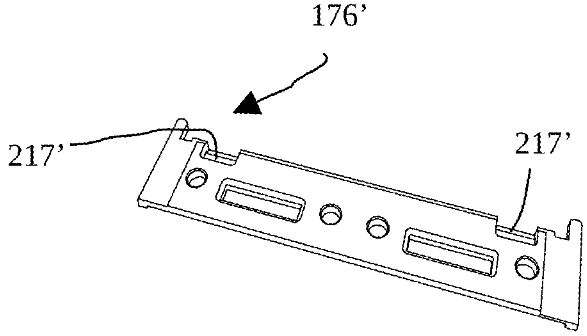
FIG. 69, in a perspective view, illustrates an alternative carriage component rear cover.

In some embodiments, the card holder 100' includes alternative carriage component front and rear covers 176' and 178', seen in FIGS. 68 and 69 respectively, which are similar to the corresponding components of the card holder 100. However, the carriage component front cover 176' differs from the previously described similar component in that it includes a pair of hook tabs 215' protruding from the underside thereof, opposed to the front cover engaging ledges 214'. The hook tabs 215' are substantially plate-shaped, with a distal enlarged portion. Corresponding tab receiving recesses 217' are formed in the carriage component rear cover 178' to receive the hook tabs 215'. The tab receiving recesses 217' are configured such that when the carriage component front cover 176' is mounted to the carriage component rear cover 176', the enlarged portion of the hook tabs 215' engages a correspondingly shaped portion of the tab receiving recess 217' to further secure the carriage component front and rear covers 176' and 178' to each other.

Figure 70:
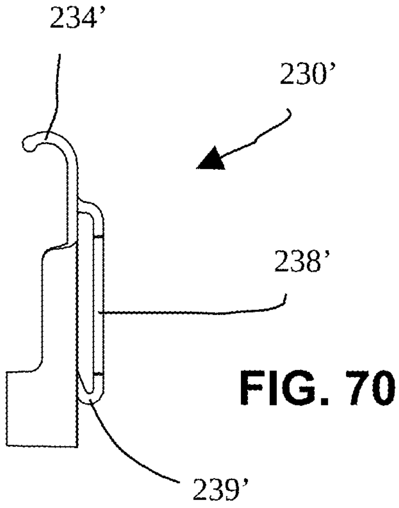
FIG. 70, in a side elevation view, illustrates an alternative belt holster case.

Also, in some embodiments, as seen in FIG. 70, the belt holster case 230' is configured with a restraint hook 234' that defines a relatively shallow concavity to facilitate insertion and removal of the card holder 100'. Furthermore, the belt clip loop 238' is provided with a hooked bottom portion 239' to better secure to a belt.

Although the present invention has been described hereinabove by way of exemplary embodiments thereof, it will be readily appreciated that many modifications are possible in the exemplary embodiments without materially departing from the novel teachings and advantages of this invention. Accordingly, the scope of the claims should not be limited by the exemplary embodiments, but should be given the broadest interpretation consistent with the description as a whole. The present invention can thus be modified without departing from the spirit and nature of the subject invention as defined in the appended claims.

What is claimed is:

1. A card holder for carrying a card, the card defining a card front face, the card holder comprising:

a casing, the casing defining a card receiving portion for receiving the card, the casing further defining a front aperture substantially parallel to and in register with the card receiving portion so that a card received in the card receiving portion shows at least part of the card front face through the front aperture;

a front cover movable between a card hiding configuration wherein the front aperture is covered by the front cover to obstruct from view the card front face, and a card showing configuration wherein the front cover is retracted from at least part of the front aperture to at least partially show the card front face;

the casing further defining a card slit positioned adjacent the card receiving portion, the card slit and card receiving portion being operatively coupled to each other to allow selective passage of at least part of the card from the card receiving portion and through the card slit so that the card at least partially protrudes from the casing;

wherein the front cover is slidable across the front aperture when moving between the card hiding and showing configurations;

wherein the casing defines a cover slit for allowing passage of at least part of the front cover therethrough when the front cover is moved from the card hiding configuration to the card showing configurations;

wherein the carriage defines a stopper, the stopper being between the card receiving portion and the card slit in the card hiding configuration, and the stopper being withdrawn from the card receiving portion in the card showing configuration to allow selective movement of at least part of the card from the card receiving portion to the card slit.

2. The card holder as defined in claim 1, wherein the front cover includes a carriage component mounted to the casing and slidable therealong in a direction perpendicular to the cover slit, the carriage component being mounted to the casing so that sliding the carriage along the casing moves the front cover between the card hiding and showing configurations.

3. The card holder as defined in claim 1, wherein the cover slit and the card slit are substantially perpendicular to each other.

4. The card holder as defined in claim 1, wherein the front cover defines a concealable area, wherein, in the card hiding configuration, the concealable area is hidden inside the casing, and in the card showing configuration, the concealable area protrudes from the casing.

5. The card holder as defined in claim 1, wherein the card holder includes a single card receiving portion inside the casing configured for receiving a single card thereinto.

6. The card holder as defined in claim 1, further comprising a card handler for holding the card, the card handler being mounted to the casing in register with the front aperture so as to be movable therealong in a direction substantially perpendicular to the card slot, the card handler being movable between card handler retracted and extended configurations, wherein the card handler is closer to the card slit in the card handler extended configuration than in the card holder retracted configuration.

7. The card holder as defined in claim 1, wherein the casing further includes a wirelessly accessible element including information accessible through a wireless communication protocol.

8. The card holder as defined in claim 1, wherein the casing further includes a frame defining the front aperture and a rear plate extending across the card receiving portion opposed to the front aperture.

9. The card holder as defined in claim 1, wherein the card receiving portion includes card holding members for mounting the card thereto, the card mounting members being configured and sized to prevent removal of the card through the front aperture.

10. The card holder as defined in claim 1, wherein the casing defines a Faraday cage around the card in the card hiding configuration.

11. The card holder as defined in claim 1, further comprising a belt holster case for holding the casing.

12. A combination comprising:

a card defining a card front face and an opposed card rear face;

a casing for enclosing the card, the casing defining a card receiving portion for receiving the card, the casing further defining a front aperture substantially parallel to and in register with the card receiving portion so that a card received in the card receiving portion shows at least part of the card front face through the front aperture, the casing further defining a card slit positioned adjacent the card receiving portion; and a front cover mounted to the casing;

wherein the combination is movable between a card hiding configuration, a card showing configuration, and a card protruding configuration, wherein in the card hiding configuration, the front cover obstructs the front aperture and the card is entirely contained in the casing;

in the card showing configuration, the front cover is retracted from at least part of the front aperture and the card is entirely contained in the casing; and in the card protruding configuration, part of the card protrudes from the card slit outside of the casing;

wherein the front cover is slidable across the front aperture when moving between the card hiding and showing configurations;

wherein the casing defines a cover slit for allowing passage of at least part of the front cover therethrough when the combination is moved from the card hiding configuration to the card showing configurations;

wherein the carriage defines a stopper, the stopper being between the card receiving portion and the card slit in the card hiding configuration, and the stopper being withdrawn from the card receiving portion in the card showing configuration to allow selective movement of at least part of the card from the card receiving portion to the card slit.

13. The combination as defined in claim 12, wherein the card is prevented from protruding through the card slit when the front cover obstructs the front aperture.

14. The combination as defined in claim 12, wherein the front cover defines a concealable area, wherein in the card hiding configuration, the concealable area is hidden Inside the casing, and in the card showing configuration, the concealable area protrudes from the casing.

15. The card holder as defined in claim 1, wherein the casing is tamper-proof to prevent undetected removal of the card from the casing.

* * * * *